United States Patent
Huang et al.

(10) Patent No.: US 10,353,598 B2
(45) Date of Patent: Jul. 16, 2019

(54) SYSTEM AND METHOD FOR REFRESHING DATA IN A MEMORY DEVICE

(71) Applicant: SanDisk Technologies, Inc., Plano, TX (US)

(72) Inventors: Jianmin Huang, San Carlos, CA (US); Bo Lei, San Ramon, CA (US); Jun Wan, San Jose, CA (US); Niles Yang, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/507,321

(22) Filed: Oct. 6, 2014

(65) Prior Publication Data

US 2016/0098216 A1  Apr. 7, 2016

(51) Int. Cl.
| | |
|---|---|
| *G06F 3/06* | (2006.01) |
| *G06F 11/07* | (2006.01) |
| *G06F 11/10* | (2006.01) |
| *G11C 11/56* | (2006.01) |
| *G11C 16/04* | (2006.01) |

(52) U.S. Cl.
CPC ............ *G06F 3/0619* (2013.01); *G06F 3/064* (2013.01); *G06F 3/0688* (2013.01); *G06F 11/073* (2013.01); *G06F 11/076* (2013.01); *G06F 11/079* (2013.01); *G06F 11/1072* (2013.01); *G11C 11/5628* (2013.01); *G11C 16/0483* (2013.01)

(58) Field of Classification Search
CPC .... G06F 11/1068; G06F 11/106; G11C 16/10; G11C 16/3431; G11C 16/3418; G11C 11/406

USPC ......................................................... 711/106
See application file for complete search history.

(56) References Cited

U.S. PATENT DOCUMENTS

| | | | | |
|---|---|---|---|---|
| 6,128,224 A | * | 10/2000 | Morton | G11C 16/10 365/185.18 |
| 6,396,744 B1 | * | 5/2002 | Wong | G11C 11/56 365/185.22 |

(Continued)

FOREIGN PATENT DOCUMENTS

| | | |
|---|---|---|
| CN | 103853582 | 6/2014 |
| TW | 454192 | 9/2001 |
| WO | 2009/086177 A1 | 9/2009 |

OTHER PUBLICATIONS

International Search Report corresponding to International Application No. PCT/US2015/051845 dated Dec. 18, 2015, 3 pages.

(Continued)

*Primary Examiner* — April Y Blair
*Assistant Examiner* — Rong Tang
(74) *Attorney, Agent, or Firm* — Dickinson Wright PLLC

(57) ABSTRACT

Systems, apparatuses, and methods are provided that refresh data in a memory. Data is programmed into the memory. After which, part or all of the data may be refreshed. The refresh of the data may be different from the initial programming of the data in one or more respects. For example, the refresh of the data may include fewer steps than the programming of the data and may be performed without erasing a section of memory. Further, the refresh of the data may be triggered in one of several ways. For example, after programming the data, the data may be analyzed for errors. Based on the number of errors found, the data may be refreshed.

13 Claims, 27 Drawing Sheets

(56) References Cited

U.S. PATENT DOCUMENTS

| | | | | |
|---|---|---|---|---|
| 7,038,950 B1* | 5/2006 | Hamilton | ............ | G11C 11/5628 365/185.2 |
| 8,972,652 B2* | 3/2015 | Kim | ................ | G11C 16/3418 711/103 |
| 2008/0301525 A1* | 12/2008 | Hirose | ................ | G06F 11/1068 714/763 |
| 2009/0161466 A1* | 6/2009 | Hamilton | ............... | G11C 16/10 365/222 |
| 2013/0141984 A1* | 6/2013 | Hirose | ................ | G11C 16/3459 365/185.21 |
| 2013/0173844 A1* | 7/2013 | Chen | ................... | G06F 12/0246 711/103 |
| 2013/0185606 A1* | 7/2013 | Fai | ..................... | G06F 11/1068 714/704 |
| 2013/0279284 A1* | 10/2013 | Jeong | ................... | G11C 11/402 365/222 |
| 2014/0146605 A1* | 5/2014 | Yang | ................... | G11C 11/5628 365/185.03 |
| 2014/0233299 A1 | 8/2014 | Lan et al. | | |
| 2014/0281820 A1* | 9/2014 | Alrod | ................. | G11C 16/3459 714/773 |
| 2015/0355845 A1* | 12/2015 | Lee | ....................... | G06F 3/0679 711/103 |
| 2016/0092129 A1* | 3/2016 | Agarwal | ............... | G06F 3/0619 714/764 |

OTHER PUBLICATIONS

Written Opinion of International Searching Authority corresponding to International Application No. PCT/US2015/051845 dated Dec. 18, 2015, 6 pages.

First Office Action issued in co-pending Chinese Patent Appln. No. 201580046777.4, dated Mar. 18, 2019.

* cited by examiner

| WL# | First | Foggy | Fine |
|---|---|---|---|
| 0 | 1 | 3 | 6 |
| 1 | 2 | 5 | 9 |
| 2 | 4 | 8 | 12 |
| 3 | 7 | 11 | 15 |
| 4 | 10 | 14 | 18 |
| .. | .. | .. | .. |
| 82 | 244 | 248 | 252 |
| 83 | 247 | 251 | 255 |
| 84 | 250 | 254 | 257 |
| 85 | 253 | 256 | 258 |

FIG. 7B

SYSTEM AND METHOD FOR REFRESHING DATA IN A MEMORY DEVICE

TECHNICAL FIELD

This application relates generally to managing data in a system. More specifically, this application relates to refreshing data in a memory device.

BACKGROUND

A memory device may program data into cells therein. However, there may be problems in reading the data programmed into the cells, either immediately after programming or over time. For example, in the context of flash memory, data programmed into multi-level cells (in which multiple bits are programmed into a single cell) may degrade due to data retention problems.

BRIEF SUMMARY

Systems and methods to refresh data in a memory device are disclosed. In one aspect, a memory device is disclosed. The memory device includes a non-volatile memory and processor circuitry in communication with the non-volatile memory. The processor circuitry includes: an erase module configured to erase a section in the non-volatile memory; a program module configured to program data into the section of memory only after the section of memory has been erased by the erase module; and a refresh module configured to refresh part or all of the data in the section of memory without the section of memory having been erased by the erase module.

In another aspect, a memory device, comprising memory controller circuitry and one or more memory chips, is disclosed. The memory controller circuitry includes: an error correction module configured to determine errors in data read from one or more memory chips; and a refresh trigger module configured to determine, based on the errors, whether to command a refresh of part or all of the data. The one or more memory chips are in communication with the memory controller circuitry, with each including: a memory array; a refresh module configured to, responsive to a refresh command, refresh part or all of the data in the memory array; and a program verify module configured to verify the refresh of the part or all of the data in the memory array.

In still another aspect, a method is disclosed. The method, which is performed in a memory device, includes: programming data into a section of memory in the memory device using a first programming scheme; determining one or more errors in the data in the section of the memory; determining, based on the one or more errors, whether to refresh part or all of the data; and in response to determining to refresh the part or all of the data, programming the part or all of the data into the section of the memory using a second programming scheme, the second programming scheme being different from and having fewer steps than the first programming scheme.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

The system may be better understood with reference to the following drawings and description. In the figures, like reference numerals designate corresponding parts throughout the different views.

FIG. 7B is a table of a sequence of programming wordlines for the programming sequence illustrated in FIG. 7A.

DETAILED DESCRIPTION

As discussed in the background, the memory device may program data into memory cells. The memory cells may be programmed to store one bit, or multiple bits, within a respective cell. For example, the memory cells may be operated to store two levels of charge so that a single bit of data is stored in each cell. This is typically referred to as a binary or single level cell (SLC) memory. As another example, the memory cells may be operated to store more than two detectable levels of charge in each charge storage element or region, thereby to store more than one bit of data in each. This latter configuration is referred to as multi-level cell (MLC) memory. One or both types of memory cells may be used in a memory, for example binary flash memory may be used for caching data and MLC memory may be used for longer term storage.

Figure 14A:
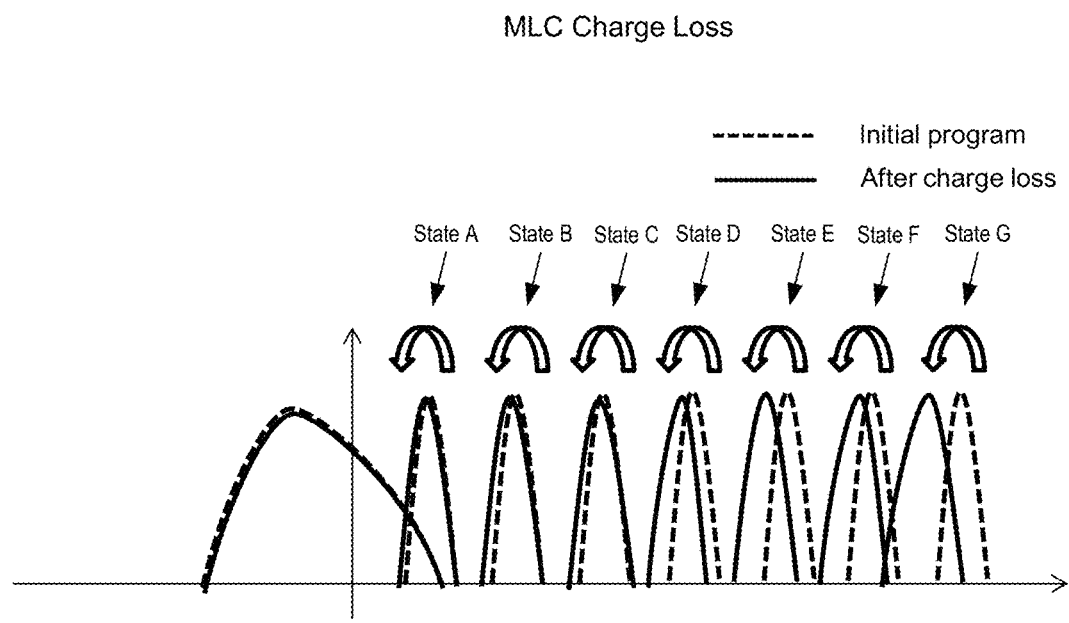
FIG. 14A illustrates a first graph of the different states of a 3-bit-per-cell at various stages, including a change due to charge loss.

For example, in an MLC memory cell configured to store 3 bits of information, there are $2^3=8$ possible states necessary to represent the 3 bits. The 8 states (referred to herein as Er, A, B, C, D, E, F, and G, where Er refers to the erase state) are 8 discrete voltage levels ($V_t$) that the cell may be programmed to. An example of the programmed 8 states after being freshly programmed is illustrated as the dashed lines in the graph of FIG. 14A. Likewise, an example of the programmed state for an SLC after being freshly programmed is illustrated as the dashed lines in the graph of FIG. 14C. The examples of the number of bits per cell stored are merely for illustration purposes.

However, either immediately or over time, reading the data from the memory cells may result in error. The error in reading may be due to a Vt shift (such as a Vt downshift). More specifically, the Vt shift may occur: at fresh condition immediately after programming of the cell; due to data retention problems; and/or due to heavy cycling of the memory device. For example, after programming of the cell, the Vt may downshift causing an increased fail bit count (FBC) thereby causing system performance to decrease and potentially causing misdetection of high bit error rate (BER) in the memory device.

The Vt downshift phenomenon may cause the Vt distribution of the states to be slightly widened on the tail side, even without data retention problems, discussed below. This type of Vt downshift is typically not a sufficiently severe issue to immediately cause uncorrectable error correction code (UECC), but may cause the fail bit count (FBC) to increase. The increased FBC due to fresh condition Vt downshift may have two negative impacts: (1) as FBC increases at the early life, the memory device read performance may be impacted due to longer error correction coding (ECC) decode time; and (2) there may be a higher chance to cause over-detection for system BER, thereby triggering other system level error handling mechanism (such as read scrub/refresh, CVD, EPWR/RBAX recover, etc.) and retarding overall system performance and introducing additional P/E cycles unnecessarily.

As another example, the Vt may shift due to data retention problems. More specifically, data retention problems may cause the memory device Vt distribution to be widened and down shifted more on the right tail.

As still another example, the Vt may shift due to memory device operations. More specifically, as the memory device is being heavily cycled, program disturb and over programming condition may become increasingly severe, thereby causing the memory device Vt distribution to widen on both the right and left tails, and eventually cause UECC as the memory device has tried to reach the maximum endurance. Thus, the cells may lose charge, such as illustrated as the solid lines in the graph of FIGS. 14A and 14C (which deviates from the charge upon programming).

Typically, as the Vt shift worsens, the memory device needs to reprogram the data located in the first block. In particular, a second block, which had been previously erased, would be selected. The memory device would then program the second block with the data originally stored in the first block. Thereafter, the first block would be erased in order to enable other data to be programmed therein.

Figure 14B:
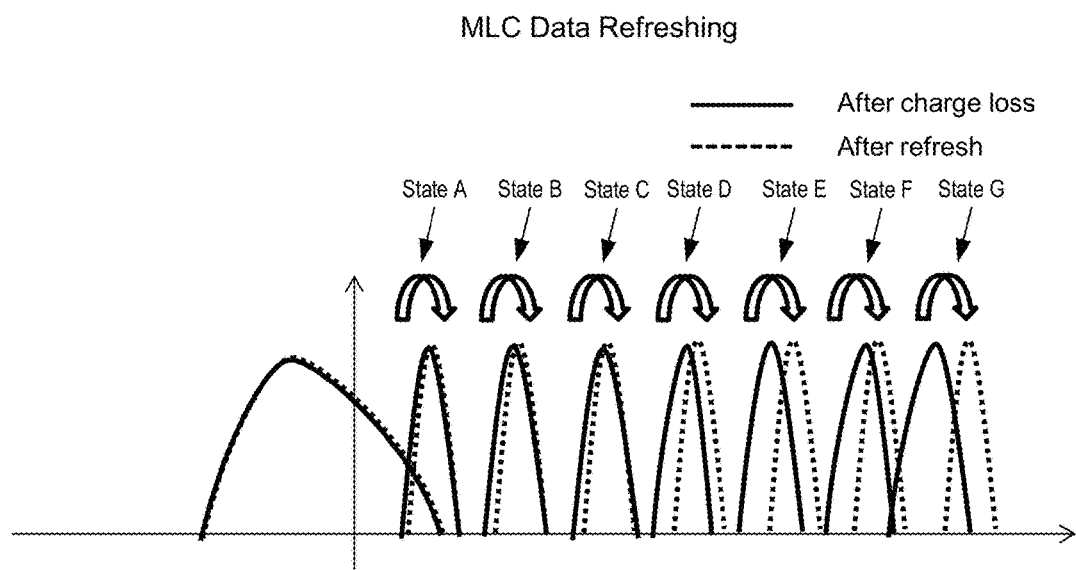
FIG. 14B illustrates a first graph of the different states of a 3-bit-per-cell at various stages, including a change due to refresh.
Figure 14C:
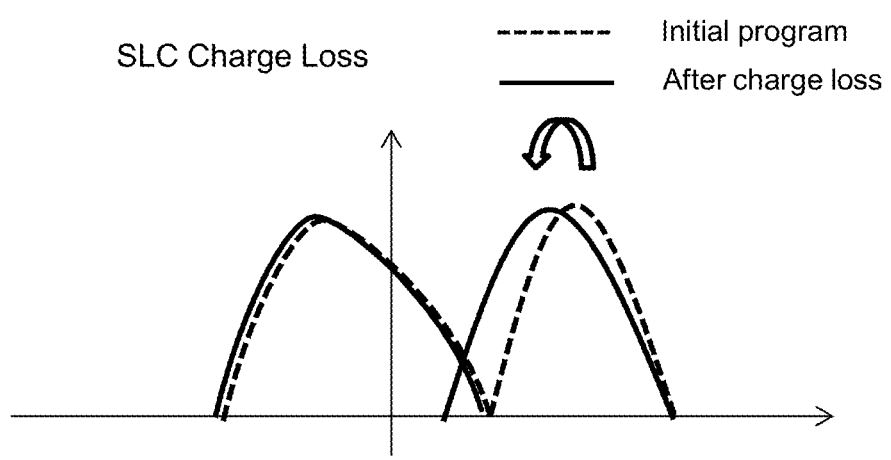
FIG. 14C illustrates a first graph of the different states of a 1-bit-per-cell at various stages, including a change due to charge loss.
Figure 14D:
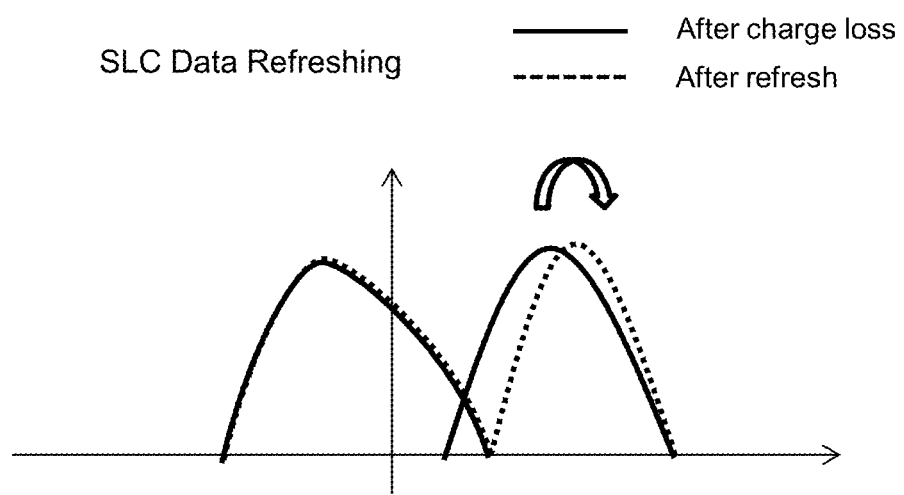
FIG. 14D illustrates a first graph of the different states of a 1-bit-per-cell at various stages, including a change due to refresh.

In one embodiment, the data in a section of memory (such as a block or a sub block) is not programmed into another block. Instead, the data in the section of memory is refreshed. An example of this is illustrated in FIG. 14B, in which the dashed lines illustrate the 8 states after refresh. Another example of this is illustrated in FIG. 14D, in which the dashed lines illustrate the two states in the SLC after refresh. As shown, the states after refresh reduce the Vt shift without the need for reprogramming. This is in contrast to traditional methods of relocating the data from the block into another block and erasing the block, which results in write amplification and reduces the program erase cycling capability of the memory block. In contrast, refreshing may be performed on part or all of the block (e.g., only the upper page programming, on a single wordline, or on a group of wordlines less than the entire block) with parameter changes and without the need to relocate/erase. Refreshing the upper page, for example, without an erase results in less erase stress and shorter program time.

More specifically, the memory device determines whether there are errors in part or all of the data in section of memory. In one embodiment, the memory device may determine whether there are errors by: reading part or all of the section of memory; and determining errors in the read. As discussed in more detail below, the read of the section of memory may be triggered in one of several ways, such as by an external request (e.g., a host system commanding the memory device to perform the read and/or a host system commanding the memory device to perform a write), or such as by an internal request (e.g., the memory device controller may determine to perform an internal read). For example, the trigger to read the section of memory may be in response to: folding of data from SLC into MLC; identifying a stressed section of memory (e.g., a stressed block); identifying an aged section of memory (e.g., a block with a high program/erase count). Further, errors in the read may be determined in one of several ways. One way is to use an error correction coding (ECC) engine to generate a bit error rate (BER), as discussed in more detail below.

The errors in the read may be analyzed to determine whether to refresh part or all of the section of memory. In one embodiment, the errors may be compared to a threshold. In response to determining that the errors exceed the threshold, a refresh may be performed. The threshold, against which the errors are compared, may in one embodiment be static and in an alternate embodiment be dynamic. For example, the threshold may be dynamically selected based on an operating condition (e.g., the temperature of the memory device) and/or based on age or use of the memory (e.g., different thresholds for a newly programmed MLC block, and based on program/erase cycles or read accesses of the block, as discussed in more detail below).

In response to determining to refresh the block, the refresh may be performed in one of several ways. In one embodiment, the memory device controller may command the memory chip to perform the refresh, with the memory device controller verifying whether the refresh has performed properly. For example, the memory device controller may command the memory chip to perform the refresh in a section of memory (such as a block or a wordline). Thereafter, the memory device controller may read the section of memory, determine errors in the read, and then determine based on the errors in the read whether the refresh has been performed properly. In one embodiment, in response to determining that the refresh has not been successfully performed, the memory device controller may send another command to the memory chip to perform the refresh in a section of memory, optionally with a different programming voltage for the memory chip to use in the refresh. Thereafter, the memory device controller may read the section of memory, determine the errors in the read, and again determine whether the refresh has been properly performed. In this regard, the memory device controller may iterate through multiple refresh cycles. In an alternate embodiment, in response to determining that the refresh has not been successfully performed, the memory device controller may command the reprogramming of the data (e.g., the memory device programs the data into another section of memory, and erases the section of memory).

In an alternate embodiment, the memory device controller may command the memory chip to perform the refresh, with the memory chip verifying whether the refresh has successfully performed. As discussed in more detail below, the memory chip may include a program verify circuitry, with which the memory chip may verify whether a programmed voltage has, in fact, been programmed into the cell. The memory chip may return the result of the program verify circuitry, indicating whether or not the refresh has been successfully performed. In one embodiment, in response to the memory chip indicating that the refresh has not been successfully performed, the memory device controller may command the reprogramming of the data. In an alternate embodiment, in response to the memory chip indicating that the refresh has not been successfully performed, the memory device controller may command the memory chip to again refresh the data.

In still an alternate embodiment, the memory device controller may command the memory chip to perform the refresh, with the memory device controller and/or the memory chip verifying whether the refresh has performed properly. For example, the memory device controller may command the chip to refresh the data. The memory chip may refresh the data, and use the program verify circuitry to verify whether the refresh was successfully performed. In response to the memory chip indicating that the refresh has not been successfully performed, the memory device controller may verify whether the refresh has been successfully performed. In a first more specific embodiment, after the memory device controller receives an indication that the refresh has not been successfully performed, the memory device controller may read the section of memory, without another refresh operation, and use the ECC engine to verify whether the refresh has been performed successfully. In response to the ECC engine determining that the refresh has not been performed successfully, the memory device controller may command the reprogramming of the data. In a second more specific embodiment, the memory device controller may command another refresh, with a potentially different refreshing voltage, and thereafter use the ECC engine to determine whether the refresh was performed successfully.

Figure 1A:
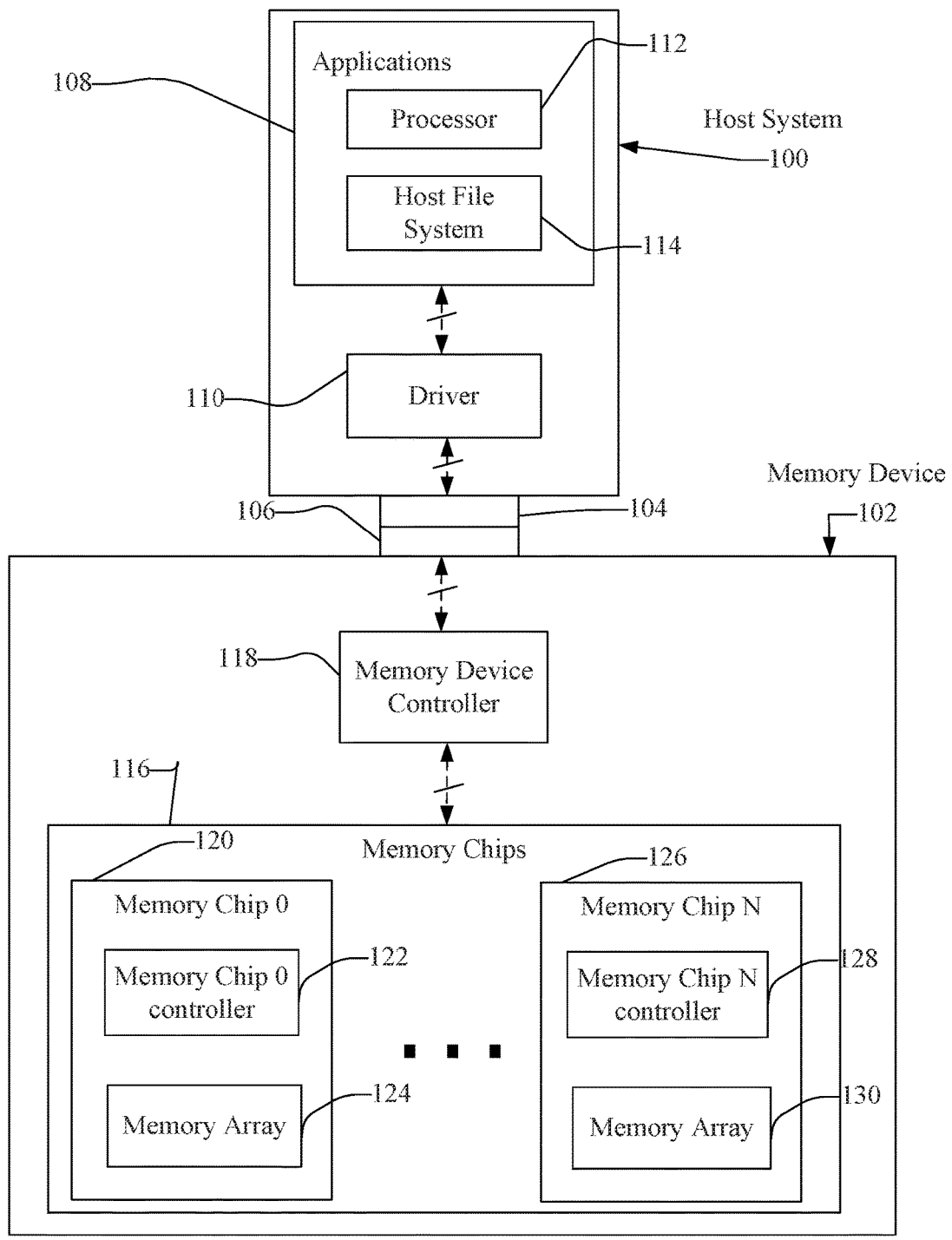
FIG. 1A illustrates a host system connected with a memory device.

Referring to the figures, FIG. 1A illustrates a host system 100 and a memory device 102. The host system 100 may comprise any type of host device, such as a stationary computer system (e.g., a desktop computer) or a mobile computer system (e.g., a laptop computer, a smartphone, a tablet computer, or the like).

The host system 100 of FIG. 1A may be viewed as having two major parts, insofar as the memory device 102 is concerned, made up of a combination of circuitry and software. They are an applications portion 108 and a driver portion 110 that interfaces with the memory device 102. In a desktop computer, laptop computer, smartphone, tablet computer, for examples, the applications portion 110 may include a processor (e.g., a CPU) 112 running word processing, graphics, control or other popular application software, as well as the file system 114 for managing data on the host system 100. In a camera, cellular telephone or other host system that is primarily dedicated to performing a single set of functions, the applications portion 108 includes the software that operates the camera to take and store pictures, the cellular telephone to make and receive calls, and the like.

The memory device 102 of FIG. 1A may comprise a semiconductor memory device. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory device can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). One example of three dimensional memory is three dimensional flash memory.

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Referring back to FIG. 1A, the memory device 102 may include non-volatile memory, such as flash memory 116 (which may be in the form of one or more memory chips), and a system controller 118 that both interfaces with the host system 100 to which the memory device 102 is connected for passing data back and forth, and controls the flash memory 116. As discussed above, other types of non-volatile memory are contemplated, such as resistive memory, which may be composed of a plurality of resistive memory cells, and ferroelectric memory.

The memory device 102 may take one of several forms. In one form, the memory device 102 may comprise an embedded device. For example, the memory device 102 may comprise a non-volatile memory configured for use as an internal or embedded SSD drive may look similar to the schematic of FIG. 1A, with the primary difference being the location of the memory device 102 internal to the host system 100. An SSD may be in the form of discrete modules that are drop-in replacements for rotating magnetic disk drives. Alternatively, the memory device 102 may be in the form of a card that is removably connected to the host system 100 through mating parts 104 and 106 of a mechanical and electrical connector as illustrated in FIG. 1A.

As discussed above, the memory device 102 of FIG. 1A may comprise a semiconductor memory device and include non-volatile memory, such as one or more memory chips 116, and a memory device controller 118. In an alternate embodiment, the memory device 102 may include both volatile and non-volatile memory.

The host system 100 may communicate with the memory device for multiple purposes. One purpose is for the host system 102 to store data on and/or read data from the memory device. For example, the host system 100 may send data to the memory device 102 for storage on the one or more memory chips 116 of the memory device 102. As another example, the host system 100 may request data from the memory device 102 that is stored on the one or more memory chips 116. When communicating with the memory device, the host system 100 may send logical addresses of data, such as in the form of a range of logical block addresses (LBAs). The memory device controller 118 may then convert the LBAs, in one or more steps, to the actual physical addresses on the memory chips 116. The memory device controller 118 may perform a logical address-to-actual physical address conversion in order to map to the actual physical addresses. For example, the LBAs from the host system 100 may be mapped to memory device internal logical addresses, and the memory device internal logical addresses are mapped to the actual physical addresses. As another example, the LBAs from the host system 100 may be mapped directly to the actual physical addresses.

FIG. 1A illustrates that the non-volatile memory 116 includes a plurality of memory chips, including memory chip 0 (120) and memory chip N (126). Memory chip 0 (120) includes memory chip 0 controller 122 and memory array 124. Likewise, memory chip N (126) includes memory chip N controller 128 and memory array 130. As discussed in more detail below, memory chip controller may comprise circuitry and/or software to control operations on the respective memory chip. Further, in one embodiment, memory array may include the memory cells on a respective memory chip.

Figure 1B:
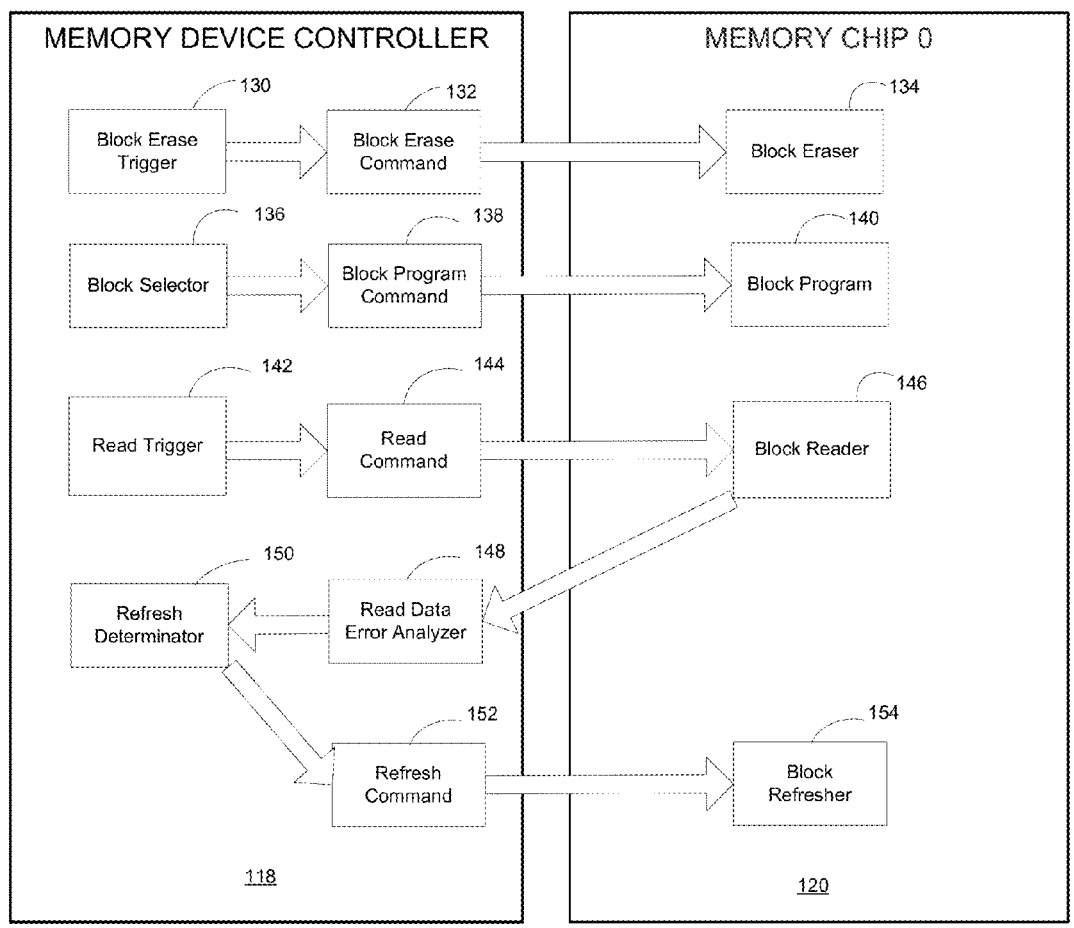
FIG. 1B illustrates another block diagram of the memory device controller and the memory chip of FIG. 1A.

FIG. 1B illustrates another block diagram of the memory device controller 118 and the memory chip 0 (120) of FIG. 1A. Memory chip 0 (120) is illustrated for purposes of example only. As shown in FIG. 1B, in one embodiment, the memory device controller 118 may command the program of a section of memory (such as a block), and may thereafter determine whether to refresh the data in the block. To that end, the host system 100 may include a block erase trigger 130, a block erase command 132, a block selector 136, a block program command 138, a read trigger 142, a read command 144, a read data error analyzer 148, a refresh determinator 150, and a refresh command 152. Any one, any combination, or all of the block erase trigger 130, the block erase command 132, the block selector 136, the block program command 138, the read trigger 142, the read command 144, the read data error analyzer 148, the refresh determinator 150, and the refresh command 152 can be implemented as software, hardware, or a combination of hardware and software.

The memory chip 0 (120) may include a block eraser 134, a block program 140, a block reader 146, a block refresher 154. Any one, any combination, or all of the block eraser 134, the block program 140, the block reader 146, the block refresher 154 can be implemented as software, hardware, or a combination of hardware and software.

The block erase trigger 130 may comprise the trigger for selecting a block in the memory array to erase. In response to the trigger from block erase trigger 130, the block erase command 132 may generate an erase command to send to the memory chip 0 (120) to erase the selected block. In response to receiving the erase command, the block eraser 134 erases the selected block. The block selector 136 is configured to select a block for programming data. In turn, the block program command 138 generates a command to send to memory chip 0 (120) to program the block. In response to receive the command, block program 140 programs the block.

The memory device controller 118 may use read trigger 142 to read the data from the memory chip 0 (120). The read trigger 142 may trigger a read based on a request from the host system 100 to read the data, or based on an internal request. In response to the trigger for a read, the read command 144 sends a command to the memory chip 0 (120). Block reader 146 reads the block (or a sub part of the block) and sends the data for error analysis by read data error analyzer 148. As discussed in more detail below, one example of read data error analyzer 148 may be a ECC engine which may generate a BER. The refresh determinator 150 may analyze the output from read data error analyzer 148 in order to determine whether to refresh part or all of the block of memory. For example, the read data error analyzer 148 may compare the BER generated from the ECC engine with a threshold to determine whether to order a refresh. In response to determining to refresh part or all of the block, the refresh command 152 sends a command to memory chip 0 (120), which may use block refresher 154 to refresh part or all of the block.

Figure 1C:
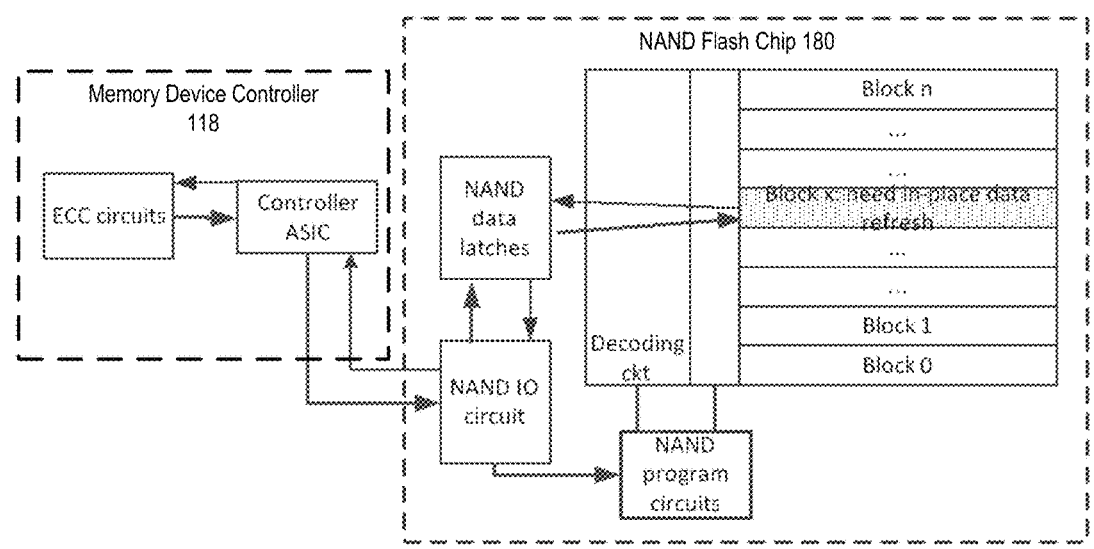
FIG. 1C illustrates a data flow of the refresh within the memory device controller and the memory chip.

FIG. 1C illustrates a data flow of the refresh within the memory device controller and the memory chip. In refreshing the data, the controller ASIC of the memory device controller 118 sends a command to the NAND I/O circuit. The command includes an indication that the command is for refresh, data for the refresh, an indication as to the block (or sub-block) for refresh, and optionally one or more programming voltages for the refresh, as discussed in more detail below. The NAND I/O circuit may send an indication to the NAND programming circuits that the operation is a refresh (as opposed to a program from an erased block) and an indication as to the section within the memory array for the program (e.g., the wordlines for program as discussed below). In turn the NAND program circuits use the decoding circuit to select the selection of memory (e.g., wordline(s), block) for program. The NAND I/O circuit further sends the data to the NAND data latches in order to latch the data for programming.

After verification, the data from the refreshed section (e.g., the refreshed wordline(s) or block) may be read out and sent to the controller ASIC. The controller ASIC may send the read out data to the ECC circuits for error analysis (e.g., the ECC circuits may generate the BER). The controller ASIC may receive the BER and then the BER. In one embodiment, the controller ASIC may compare the BER with a predefined threshold defined as a successful refreshing of the section of memory. If the BER is less than the predefined threshold, the controller ASIC may order the refresh be performed again. Alternatively, if the BER is less than the predefined threshold, the controller ASIC may order to block be reprogrammed.

Figure 2A:
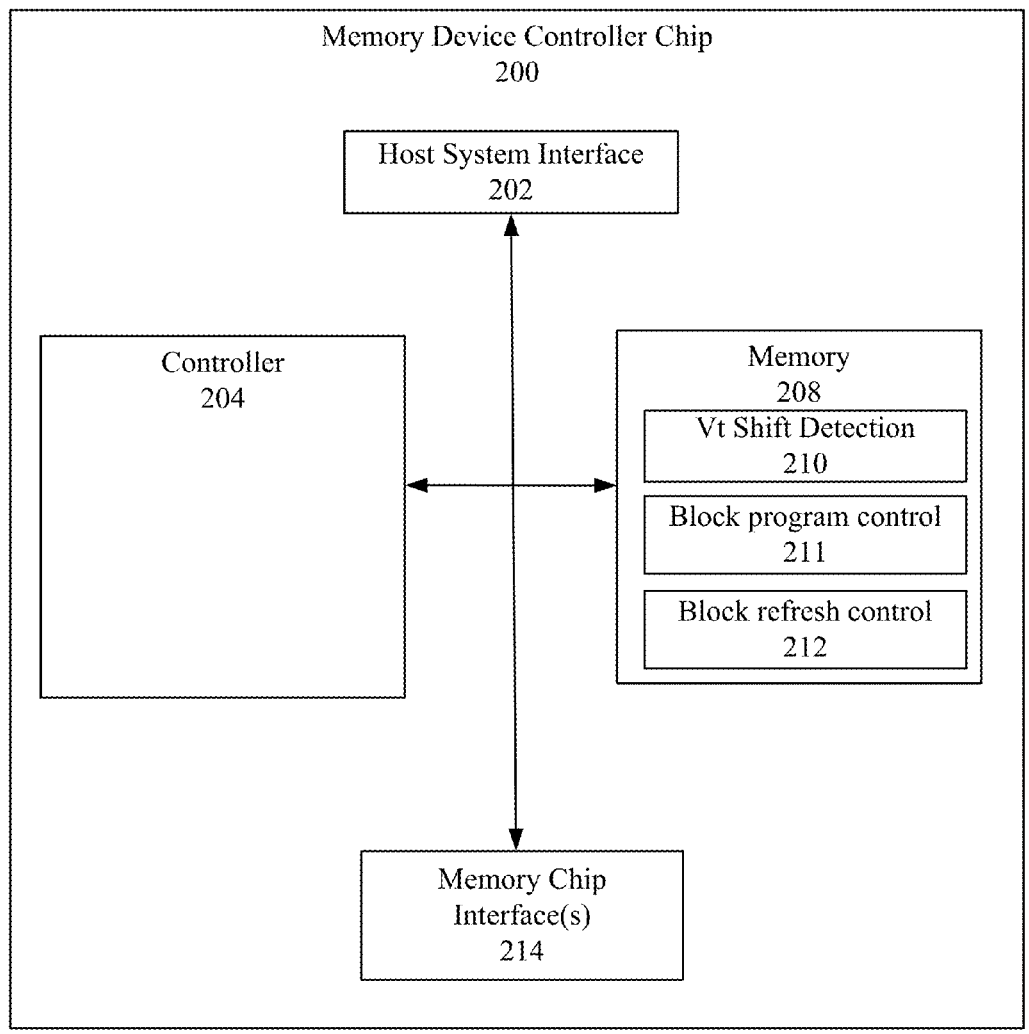
FIG. 2A illustrates memory device controller chip, which is a first example of memory device controller depicted in FIG. 1A.

FIG. 2A illustrates memory device controller chip 200, which is an example of memory device controller 118 depicted in FIG. 1A. As illustrated in FIG. 2A, memory device controller chip 200 includes host system interface 202, which may comprise circuitry and/or software in order to communicate with the host system 100. Alternatively, host system interface 202 may be external to memory device controller chip 200. Memory device controller chip 200 further includes controller 204, memory 208, and memory chip interface(s) 214. Memory 208 may include Vt shift detection 210, block program control 211, and block refresh control. Vt shift detection 210 may comprise software that is executable by controller 204 to detect a shift (such as a downshift) in Vt for a section of memory, such as in a block or in a sub-block. Block program control 211 may comprise software that is executable by controller 204 to control the memory chips 116 to program a block, as discussed in more detail below. Block refresh control 212 may comprise software that is executable by controller 204 to control the memory chips 116 to refresh a block (or a part of a block), as discussed in more detail below. Memory chip interface 214 may comprise one or more communication lines configured to communicate with one or more memory chips.

Figure 2B:
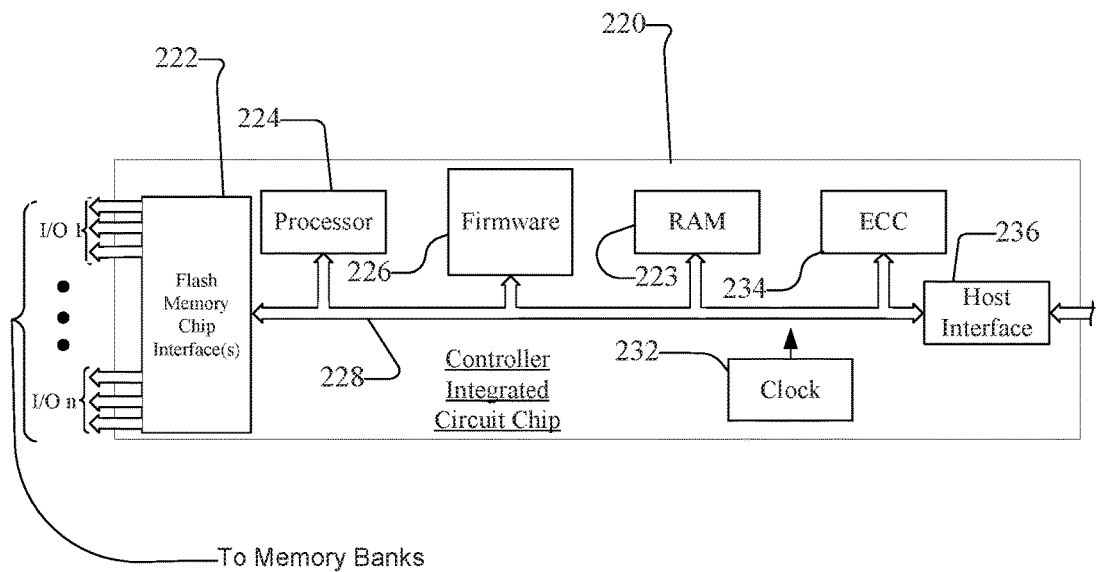
FIG. 2B illustrates memory device controller chip, which is a second example of memory device controller depicted in FIG. 1A.

FIG. 2B illustrates memory device controller chip 220, which is a second example of memory device controller 118 depicted in FIG. 1A. The memory device controller chip 220 may be implemented on a single integrated circuit chip, such as an application specific integrated circuit (ASIC), as shown in FIG. 2B. Further, the various functions performed by the memory device controller chip 220 may be performed by a single device, or may be performed by multiple devices, such as shown in FIG. 2B. More specifically, the memory device controller chip 220 may be segmented into the different devices illustrated in FIG. 2B, such as flash memory interface(s) 222, processor 224, RAM 230, ECC 234, host interface 236, and clock 232. FIG. 2B is merely for illustration purposes.

The processor 224 of the memory device controller chip 220 may be configured as a multi-thread processor capable of communicating separately with a respective memory chip via one or more flash memory interface(s) 222. The flash memory interface(s) 222 may have I/O ports for each of the respective memory chips in the flash memory 116. The memory device controller chip 220 may include an internal clock 232. The processor 224 may communicate with an error correction code (ECC) module 234 (discussed in more detail below), a RAM buffer 230, a host interface 236, and firmware 226 (which may include boot code ROM) via an internal data bus 228.

Figure 3A:
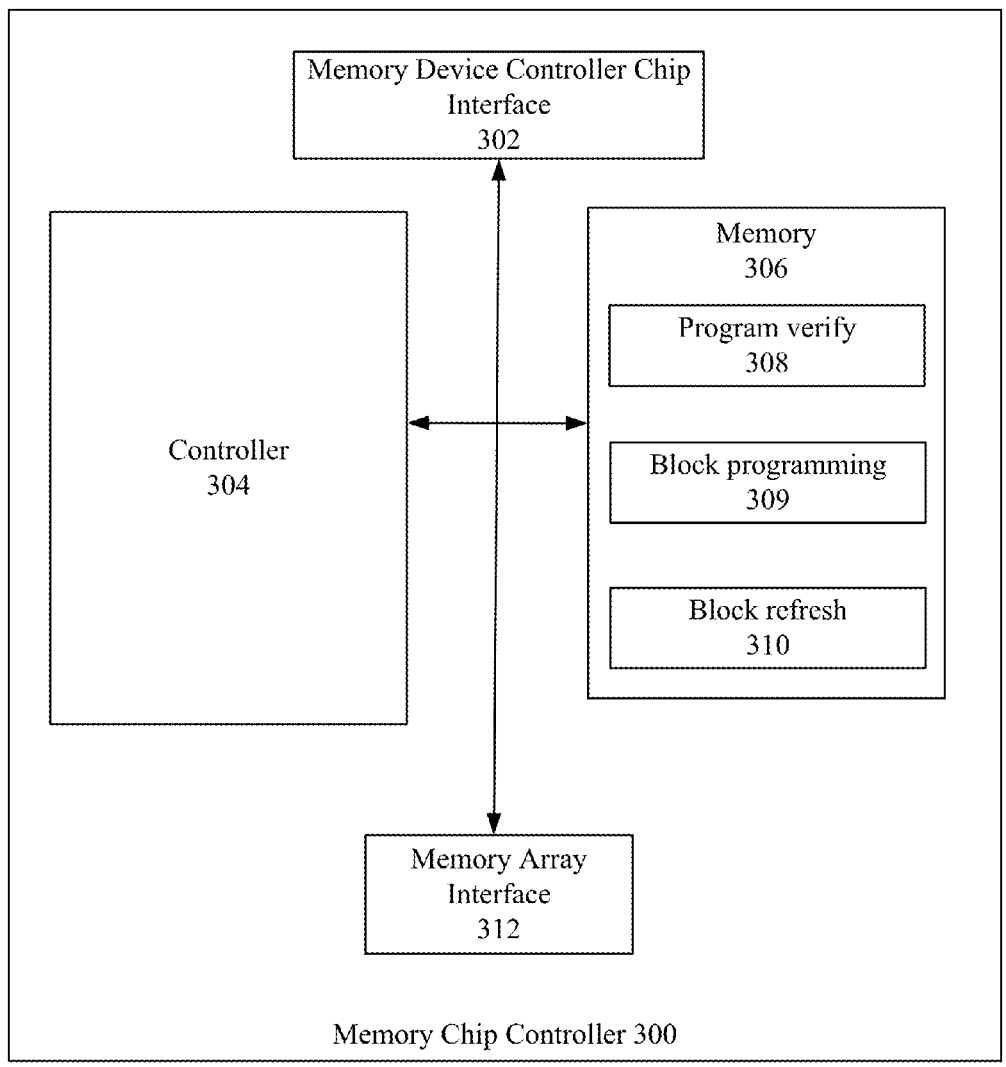
FIG. 3A illustrates an example of memory chip controller depicted in FIG. 1A.

FIG. 3A illustrates an example of memory chip controller 300, such as memory chip 0 controller 122, depicted in FIG. 1A. Memory chip controller 300 includes memory device controller chip interface 302, which is the interface with memory device controller chip 200. Memory chip controller 300 further includes controller 304 and memory 306. Memory 306 may include program verify 308, block programming 309, and block refresh 310.

Program verify 308 may be used to verify whether the data programmed into one or more memory cells has been successfully programmed. As discussed in more detail below, a program verify test may comprise a read operation in which a verity voltage (Vread) is applied and the current through the cell is compared to verify current of the program verify test (Iverify_set) or a reset verify current of the program verify test (Iverify_reset) to determine whether the set or reset state, respectively, has been reached. Program verify 308 may determine whether the program verify test has been passed. If it is determined that the program verify test has not been passed, in one embodiment, an error may be returned, and in an alternate embodiment, one or more values for the programming parameters may be updated, such as by increasing the voltage magnitude and/or duration and/or the current limit, and the programming may be performed again.

Block programming 309 may be used to program a block (or program a part of a block), as discussed in more detail below. Block refresh 310 may be used to refresh the data previously programmed in a block (or refresh a part of a block), as discussed in more detail below. Memory array interface 314 may comprise the interface to the memory array, such as memory array 124.

Figure 3B:
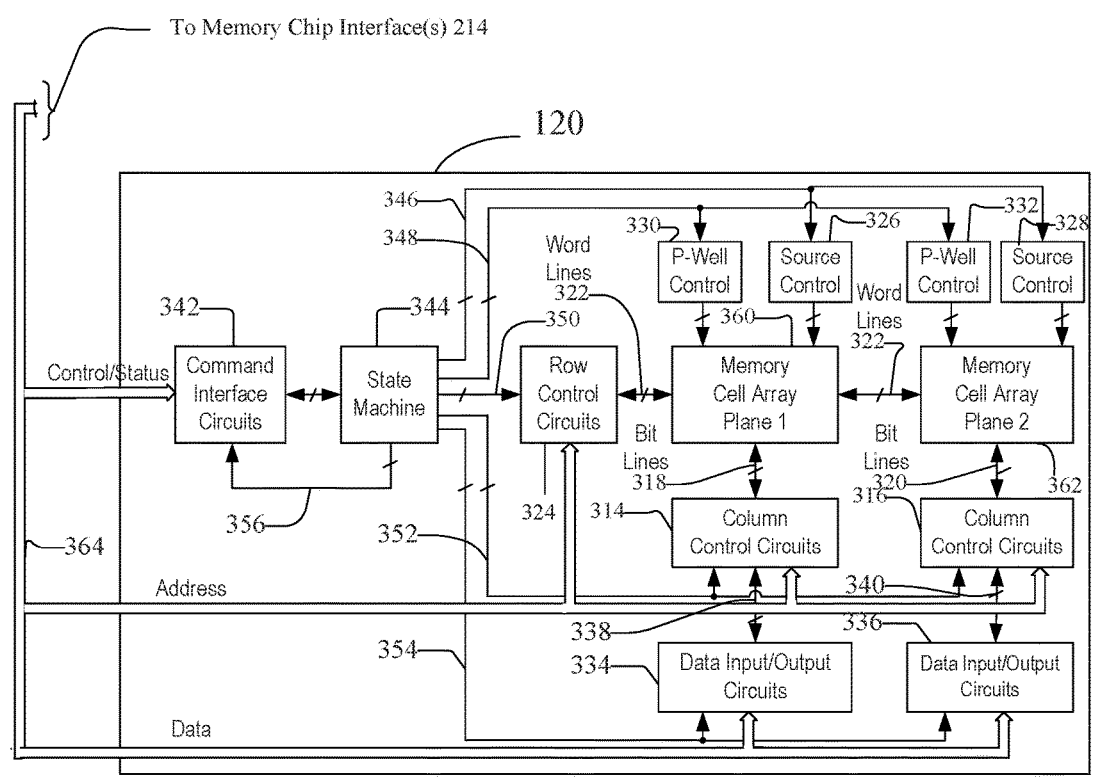
FIG. 3B illustrates an example of a block diagram of a memory chip, such as used in the memory depicted in FIG. 1A.

FIG. 3B illustrates an example of a block diagram of a memory chip, such as used in flash memory chip 0 (120) depicted in FIG. 1A. Each memory chip may contain an array of memory cells organized into multiple planes. FIG. 3B shows planes 360 and 362 for simplicity but a lesser number, such as one plane or a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array, and decode them to address a specific one or more of respective bit lines 318 and 320. The word lines 322 are addressed through row control circuits 324 in response to addresses received on the bus 364. Source voltage control circuits 326 and 328 are also connected with the respective planes, as are p-well voltage control circuits 330 and 332. If the bank is in the form of a memory chip with a single array of memory cells, and if two or more such chips exist in the system, data are transferred into and out of the planes 360 and 362 through respective data input/output circuits 334 and 336 that are connected with the bus 364. The circuits 334 and 336 provide for both programming data into the memory cells and for reading data from the memory cells of their respective planes, through lines 338 and 340 connected to the planes through respective column control circuits 314 and 316.

Although the controller 204 in the memory device chip controller 200 controls the operation of the memory chips to program data, read data, refresh data, erase and attend to various housekeeping matters, each memory chip also contains some controlling circuitry that executes commands from the memory device controller 118 to perform such functions, such as programming functionality, refresh functionality, and program verification functionality. Interface circuits 342 are connected to the bus 364. Commands from the memory device controller 118 are provided to a state machine 344 that then provides specific control of other circuits in order to execute these commands. State machine 344 may further include error determination functionality, such as discussed herein. Control lines 346-354 connect the state machine 344 with these other circuits as shown in FIG. 3B. Status information from the state machine 344 is communicated over lines 356 to the interface 342 for transmission to the memory device controller 118 over the bus 364.

A NAND architecture of the memory cell arrays 360 and 362 is discussed below, although other non-volatile memory architectures or technologies, alone or combination, such as NOR, can be used instead. An example NAND array is illustrated by the circuit diagram of FIG. 4, which is a portion of the memory cell array 360 of the memory bank of FIG. 3B. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
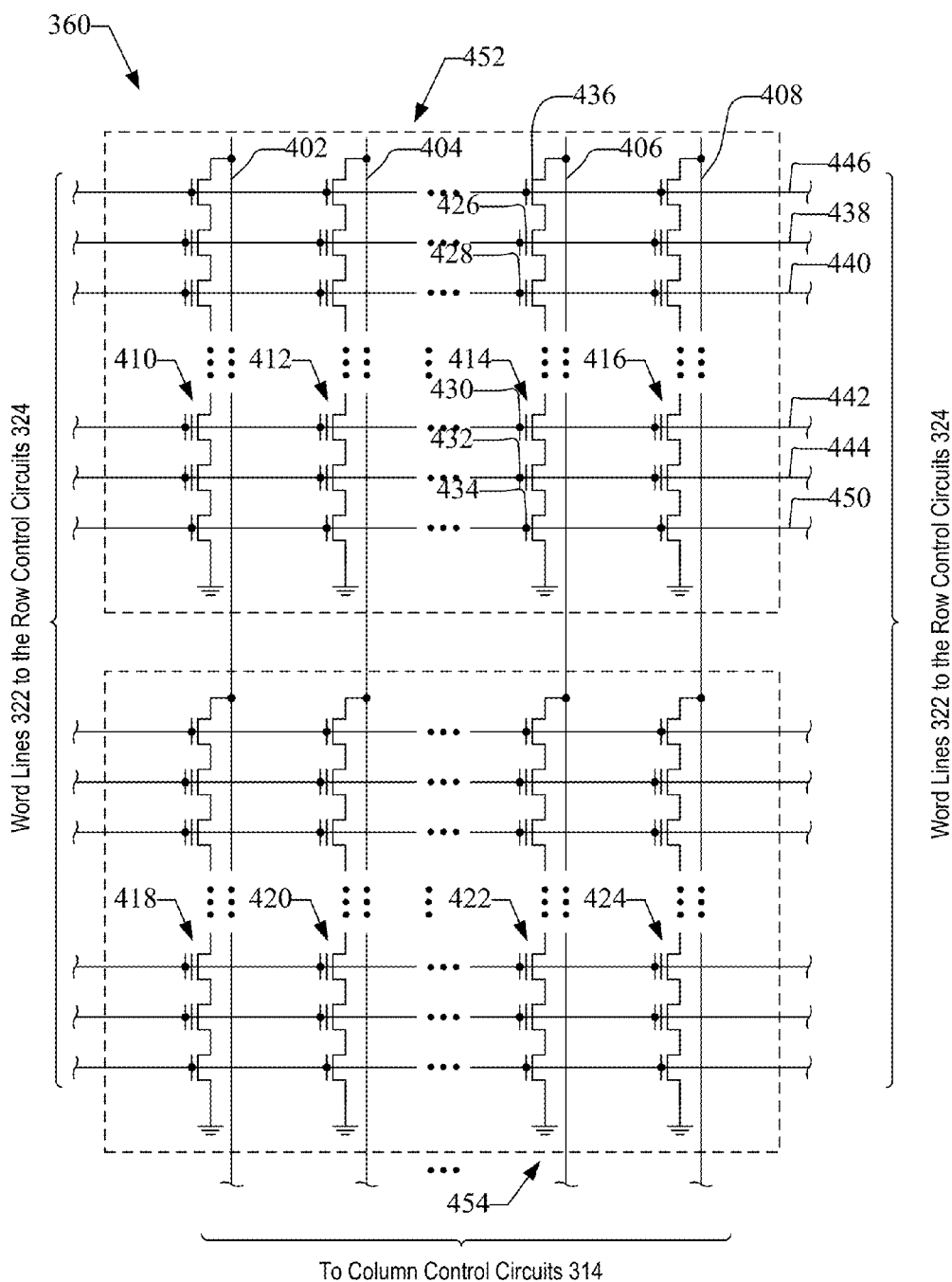
FIG. 4 is a representative circuit diagram of a memory cell array that may be used in the memory bank of FIG. 3B.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, may be programmed in parallel at a time. Typically, the rows of a NAND array are programmed in a prescribed order, in this case beginning with the row along the word line 444 closest to the end of the strings connected to ground or another common potential. The row of memory cells along the word line 442 is programmed in parallel next, and so on, throughout the block 452. The row along the word line 438 is programmed in parallel last.

A row of memory cells is merely one example of a parallel programming unit. The parallel programming unit may include one or both of the following: (1) all physical structures (such as memory cells) can be programmed/read in parallel; and (2) all physical structures can be programmed/read with the same or similar completion time. Element (2) is for purposes of efficiency, although not required for a parallel programming unit.

The row of memory of memory cells may be composed of cells that are in the same physical location on a die. Alternatively, the row of memory cells may be composed of cells that are in different physical locations on die or dies that are all programmable in parallel. Moreover, other parallel programmable units are contemplated in which memory cells may be programmed in parallel.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3B, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi-level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
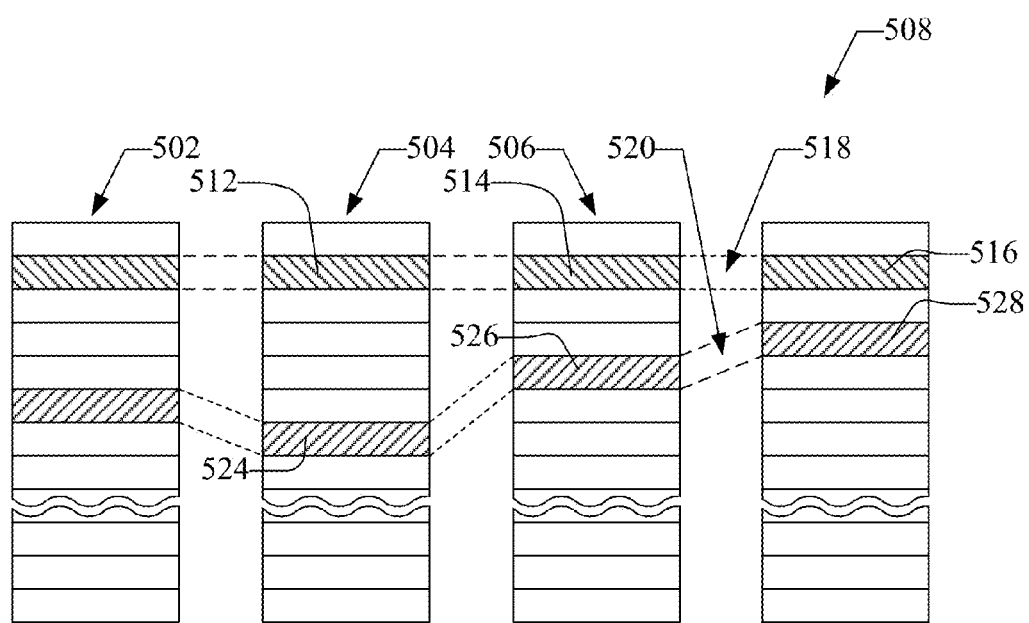
FIG. 5 illustrates an example physical memory organization of the memory bank of FIG. 3B.

FIG. 5 conceptually illustrates an organization of one bank of the multi-bank flash memory that is used as an example in further descriptions below. Four planes 502-508 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 5 by rectangles, such as blocks 510, 512, 514 and 516, located in respective planes 502-508. There can be hundreds or thousands of blocks in each plane.

As mentioned above, the block of memory cells is the unit of erase, the smallest number of memory cells that are physically erasable together. For increased parallelism, however, the blocks may be operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory device can be operated with the ability to dynamically form metablocks of any or all of one, two or three blocks in different planes. This allows the size of the metablock to be more closely matched with the amount of data available for storage in one programming operation.

Figure 6:
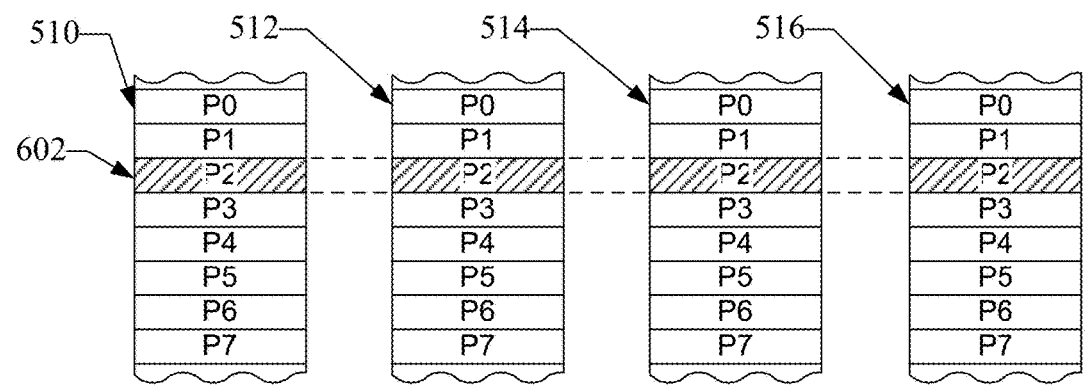
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 16, 32 or more pages of memory cells within each block. The page is the unit of data programming within a block, containing the minimum amount of data that are programmed or read at one time. In the NAND architecture of FIG. 3B, a page is formed of memory cells along a word line within a block. However, in order to increase the memory device operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a bank, a metapage is the maximum unit of programming.

Figure 7A:
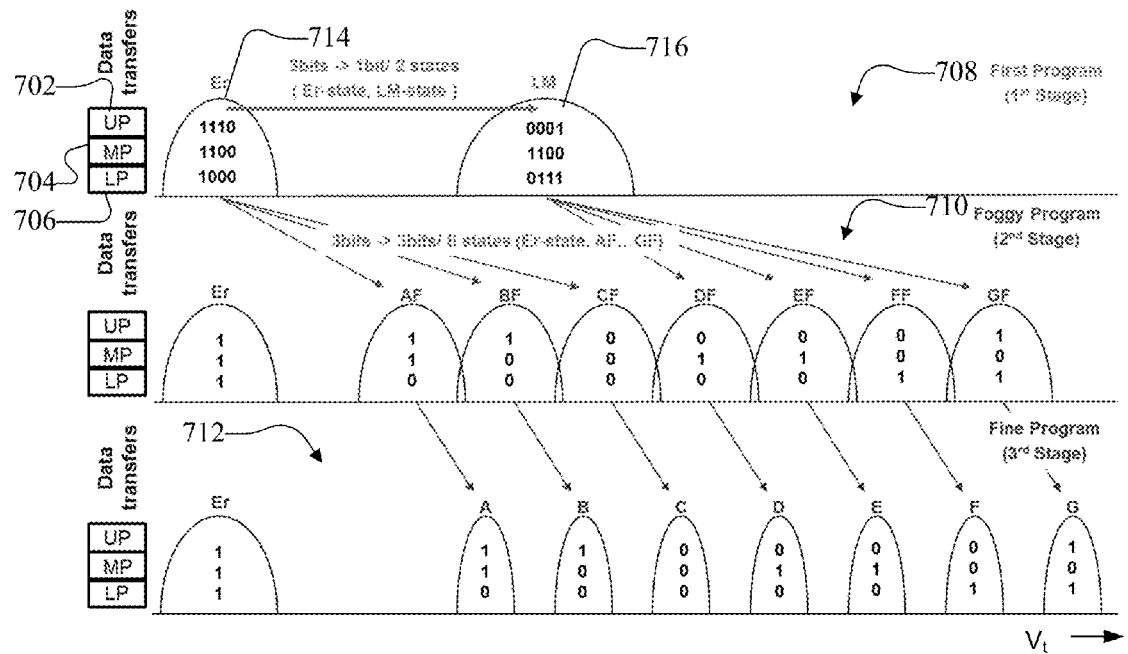
FIG. 7A illustrates an example non-volatile memory programming chart illustrating target voltage levels for each stage of a three stage NAND flash programming operation in a three bit-per-cell memory.

FIG. 7A illustrates programming of a 3-bit-per-cell NAND flash memory. The example of FIG. 7A is merely for illustration purposes. Other numbers of bits-per-cell and other types of memory are contemplated. Referring to FIG. 7A, each cell in a WL for a 3 bit-per-cell NAND flash memory may store a bit from each of 3 different pages: an upper page bit (UP) 702 a middle page bit (MP) 704 and a lower page bit (LP) 706. A typical programming operation for such a memory cell would require that the 3 original bits of host data intended for that cell be transferred from the controller to the NAND memory three times, one time for each of three programming passes needed to nudge the correct amount of charge into the cell to reach the desired voltage state without overshooting the desired voltage state.

As indicated in FIG. 7A, the three programming passes or states may be referred to herein as the first programming pass 708, the foggy programming pass 710 and the fine programming pass 712, respectively. Generally speaking, the first programming pass 708 will be a cruder voltage pulse that leaves the stored voltage at either an Erased (Er) 714 level or an intermediate level (LM 716 in FIG. 7A) where the Er voltage level permits subsequent continued programming into one of the first 4 of the 8 desired voltage states (Er, A, B or C) and the LM voltage level pushes the voltage to a threshold that can be increased to one of the latter 4 of the 8 desired voltage states (D, E, F or G).

In a typical first/foggy/fine programming scheme in the memory such as illustrated in FIG. 7A, the original 3 host bits are repeatedly sent from the controller to the NAND to perform each of the three programming stages. Thus, in the second or "foggy" programming step the UP, MP, and LP data are again sent from controller to NAND memory. The UP, MP and LP bits are used by the non-volatile memory (e.g. NAND flash) to generate the foggy programming stage voltage pulses needed to push the current state (Er or LM) achieved in the first programming step 708 to a more resolved 1 of the 8 desired states. The hypothetical voltage distribution options, along with the associated state of the 3 page bits at that voltage level, after foggy programming 710 are shown in FIG. 7A. After the second round of transmitting the original 3 bits of data to NAND memory and carrying out the second, or foggy, programming stage 710, the original three bits are again retrieved from RAM in the controller and sent to the NAND to provide the last, or fine, programming steps 712 necessary to achieve the desired 1 of the 8 states. A distribution for the possible programming voltages achieved after the fine programming stage 712 are shown after in FIG. 7A, where the 8 possible states are shown fully restored.

Although each WL will be written to three times, the order of the writing may be interleaved among the wordlines, such as illustrated in FIG. 7B. More specifically, because the first, foggy and fine programming steps applied to neighboring wordlines may lead to program disturb issues, where charges applied to one WL may affect the charges applied to a neighboring WL, a predetermined WL programming order is typically utilized. Thus, the programming of adjacent wordlines may be interleaved to reduce the chances of a program disturb. The WL programming order may essentially progress in a diagonal pattern from lower left to upper right of the table. For example, the first programming pass to WL 0 is followed by a first programming pass to WL 1 and then the foggy programming pass back on WL 0. After that, the pattern proceeds where the first program pass on WL N (starting at N=2 in this example) is followed by the foggy program pass on WL N−1 and then the fine programming pass on WL N−2 until the first programming pass on the last WL is completed, as illustrated.

Figure 8A:
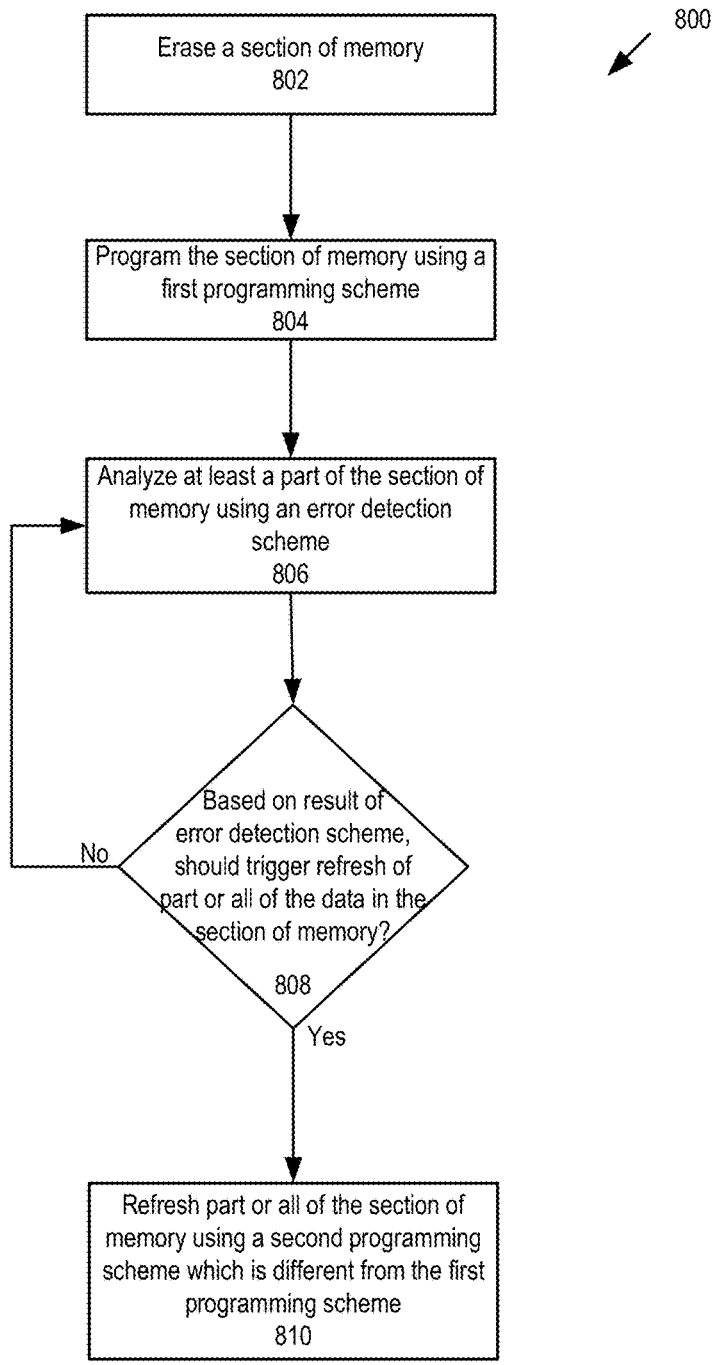
FIG. 8A illustrates a flow chart of a first example of programming data into a section of memory, determining whether to refresh the data, and refreshing part or all of the data.

FIG. 8A illustrates a flow chart 800 of a first example of programming data into a section of memory, determining whether to refresh the data, and refreshing part or all of the data. At 802, a section of memory, such as a block, is erased. At 804, the section of memory is programmed using a first programming scheme. An example of the first programming scheme is illustrated in FIG. 7A.

At 806, at least a part of the section of memory is analyzed using an error detection scheme. For example, data from part or all of the block is read and analyzed, using an ECC engine, to determine BER. Reading the data from cells in the block may be an iterative process. The read level conditions for the cells are initially set for the different states of the multi-bit cells. For example, in the 3-bit-per-cell example, the initial read voltages for the different states are as follows: A=1.5875V; B=3.1875V; C=3.4875V; D=4.2875V; E=5.0875V; F=5.8875V; G=6.3875V. The results are sent to the ECC engine to determine whether the BER is correctable. If the ECC engine determines that the BER is too high to correct the errors, the initial read voltages are modified (e.g., reduced by 0.1) and the process is repeated to determine if the generated BER is correctable. Other error detection schemes to determine an error in the data are contemplated.

At 808, based on the result of the error detection scheme, it is determined whether to trigger a refresh of part or all of the data in the section of memory. For example, the result of the error detection scheme may be compared with a threshold. In response to determining that the result of the error detection scheme indicates greater errors in the section of memory than the threshold, refresh may be triggered in the section of memory.

As discussed above, the threshold may be selected dependent on one or more factors, such as: state of the section of memory subject to potential refresh (e.g., has the data recently been folded into an MLC block; the number of program/erase cycles for the block; the number of reads to the block after the block has been programmed); environmental conditions (e.g., temperature of the memory device (e.g., temperature of the memory chip that houses the memory array); Vcc of the memory device (e.g., the power supplied to the memory chip); etc.).

For example, an ECC engine may generate a BER. The BER may be compared to a threshold to determine whether to trigger refresh of part or all of the data in the section of memory. One type of ECC engine is a BCH engine of a 2K byte data trunk (approximately 16K bits). In this example, the ECC engine is unable to correct for errors more than 122 bits, which is considered the Uncorrectable ECC (UECC). The BER may be compared against an RfECC (refresh ECC). The RfECC may be a predetermined static number, such as 100. Alternatively, the RfECC may be a variable number depending on various conditions of the memory device. As one example, a first RfECC may be used when checking an MLC block immediately after folding data from SLC into the MLC block. A second RfECC, different from the first RfECC, may be used thereafter. As another example, the RfECC may change depending on the age of or wear to the block. Various age indicators may be used, such as the program/erase cycles (P/E) or the number of reads that have been applied to the block after programming of the block. In the context of the example given above, the RfECC may change as the block ages, such as an RfECC of 100, 80, and 60, respectively as the block is determined to be "newer", "moderately aged", and "greatly aged". In this regard, the refreshing of the block (or a subpart of the block) may be more aggressive as the block ages. Likewise, the RfECC may change depending on the number of reads to the block, with the RfECC decreasing as the number of reads to the block increases. Again, in this regard, the refreshing of the block (or a subpart of the block) may be more aggressive as more reads are performed on the block.

As still another example, the RfECC may change depending on the overall conditions of the memory device. Overall conditions may include conditions internal to the memory device, such as the Vcc level (which may be determined by system circuitry), or may include ambient conditions to the memory device, such as temperature. In the context of temperature, the RfECC may be higher when the temperature of the memory device is higher than a temperature threshold, and may be lower when the temperature of the memory device is lower than a temperature threshold.

In response to determining to refresh the section of memory, at 810, the refreshing of the section of memory may be performed on part (or all) of the section of memory.

The refreshing may be performed using a second programming scheme which is different from the first programming scheme used at 804.

As discussed above, FIG. 7A illustrates one example of a programming scheme that may be used at 804 after erasing a block. Because at 810 a refresh is performed, data is already programmed in the section of memory, albeit with a shifted Vt. In this regard, the step(s) to perform the refresh and/or the voltages used in the steps may be different from the programming scheme used at 804 after erasing the block. For example, FIG. 7A illustrates different steps of first/foggy/fine. In one embodiment, the refresh does not perform the "first" step and the "foggy" step, instead only performing the "fine" step. As another example, the voltages used in the refresh may be different from the programming scheme used at 804 after erasing the block.

For example, in the 3-bit-per-cell NAND flash memory, the refresh procedure may comprise using an initial programming voltage. As discussed in more detail below, the initial programming voltage may be static or dynamic. Cells that are to be programmed to the same state are programmed together. More specifically, a wordline may include, for example, 140 thousand cells. Each of the cells on the wordline for refreshing to the A state may be programmed at the same time. After applying the programming voltage, the program verify circuitry may use a set of predetermined voltages to determine whether the cell has been properly programmed. For exemplary purposes, the verify levels for the 3-bit-per cell NAND flash memory, from A to G, may comprise 0.8, 1.6, 2.4, 3.2, 4.0, 4.8, 5.6V. In the event that the program verify fails, the initial programming voltage may be increased (e.g., by 40 mV), and the process may be repeated. In one embodiment, the number of repeats of the process may be limited to a predetermined number. After which, the memory chip may report a failure to the memory system controller, as discussed in more detail below. This process may be repeated for each of states A through G.

As discussed above, the voltage used in the refresh operation may in one embodiment be static and in an alternate embodiment be dynamic. For example, in response to determining to perform the refresh, predetermined static voltage(s) may be used to refresh the section of memory. As another example, in response to determining to perform the refresh, the voltages used in the refresh may be dynamically selected. More specifically, the voltages may be selected based on one or more factors including: the amount of errors in the section of memory; and/or the overall conditions of the memory device. For example, a lookup table may correlate different BERs to different programming voltages. In this regard, a higher BER may result in a higher programming voltage for the refresh operation.

In addition, in response to determining to trigger the refresh at 808, performing the refresh at 810 may be performed at various times. In one embodiment, the refresh at 810 may be immediately in response to determining to trigger the refresh at 808. In an alternate embodiment, the refresh at 810 need not be performed immediately in response to determining to trigger the refresh at 808. Rather, the section of memory, such as the block, that is subject to refresh may be added to a list of sections of memory for refresh. When the memory device is idle, the memory device may refresh the sections of memory on the list.

Further, as discussed above, different sections of memory may be refreshed. As one example, an entire block may be refreshed. More specifically, a single read within a block may trigger refresh of the entire block. As another example, a sub-part of a block may be refreshed. More specifically, one or more specific wordlines within a block may be refreshed, while the remaining wordlines in the block may be untouched. As discussed above, a block may be made up of multiple wordlines, such as wordlines 0 to 127. A read may be performed on a single wordline, such as wordline 50. The memory device may determine, based on the BER from the read from wordline 50, that wordline 50 should be refreshed. In this regard, the memory device may refresh only wordline 50, without refreshing wordlines 0-49 or 51-127.

Figure 8B:
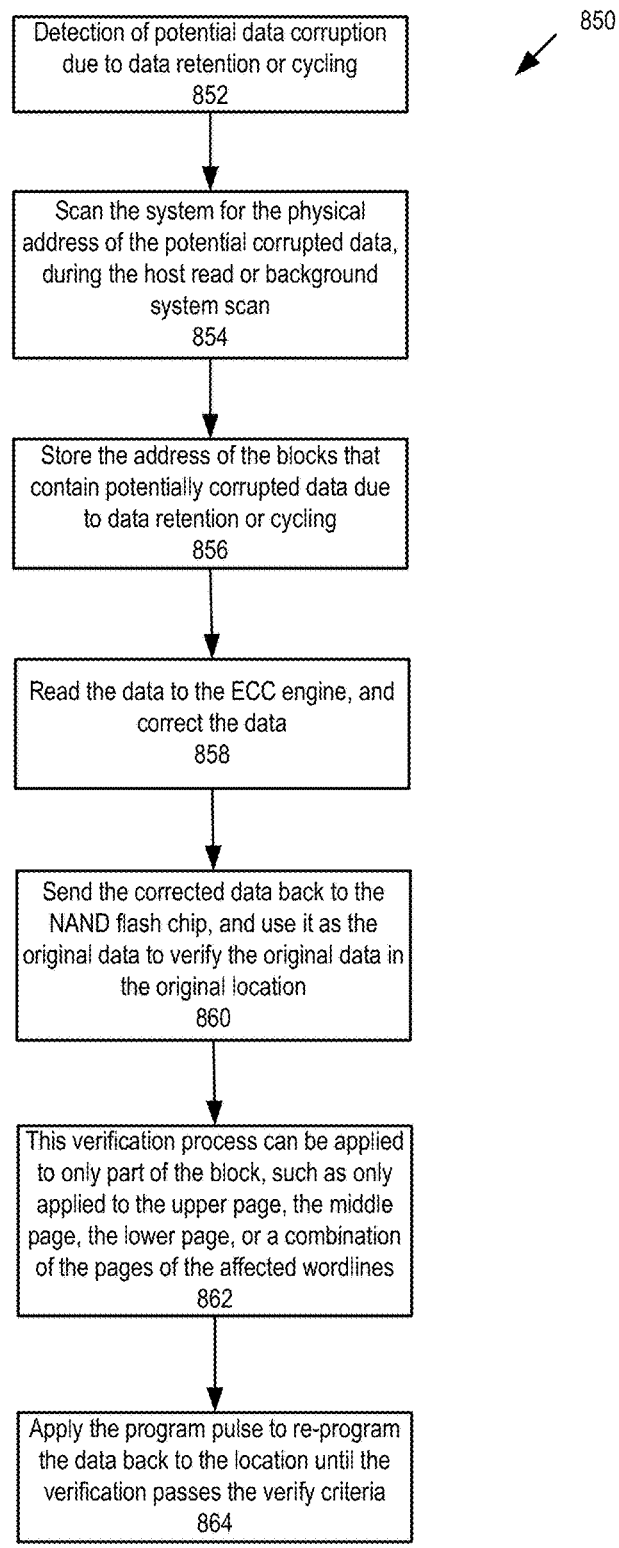
FIG. 8B illustrates a flow chart of a second example of programming data into a section of memory, determining whether to refresh the data, and refreshing part or all of the data.

FIG. 8B illustrates a flow chart 850 of a second example of programming data into a section of memory, determining whether to refresh the data, and refreshing part or all of the data. At 852, potential data corruption is detected, such as due to data retention or cycling. At 854, the system is scanned for the physical address of the potential corrupted data. The scan of the system may be performed during a host read (e.g., the host system commands the read) or during a background system scan, as discussed in more detail below.

At 856, the address of the blocks that contain potentially corrupted data due to data retention or cycling are stored. At 858, the data is read to the ECC engine, and the data is corrected. At 860, the corrected data is sent back to the NAND flash chip, and is used by the NAND flash chip as the original data to verify the original data in the original location. As discussed above, the NAND flash chip may receive the corrected data for refresh. More specifically, the NAND flash chip may, according to the corrected data received, determine which cells in a wordline are to be programmed to which state (e.g., in a 3-bit-per-cell, one of states A-G), refresh the determined cells to the state, and use program verify to determine whether the refresh has resulted in the cells having values corresponding to the state. At 862, this verification process may be applied to the entire block, or to only a part of the block, such as the upper page, the middle page, the lower page, or a combination of pages of the affected wordlines. At 864, the program pulse may be applied to re-program the data back to the location until the verify process passes the verify criteria.

Figure 9:
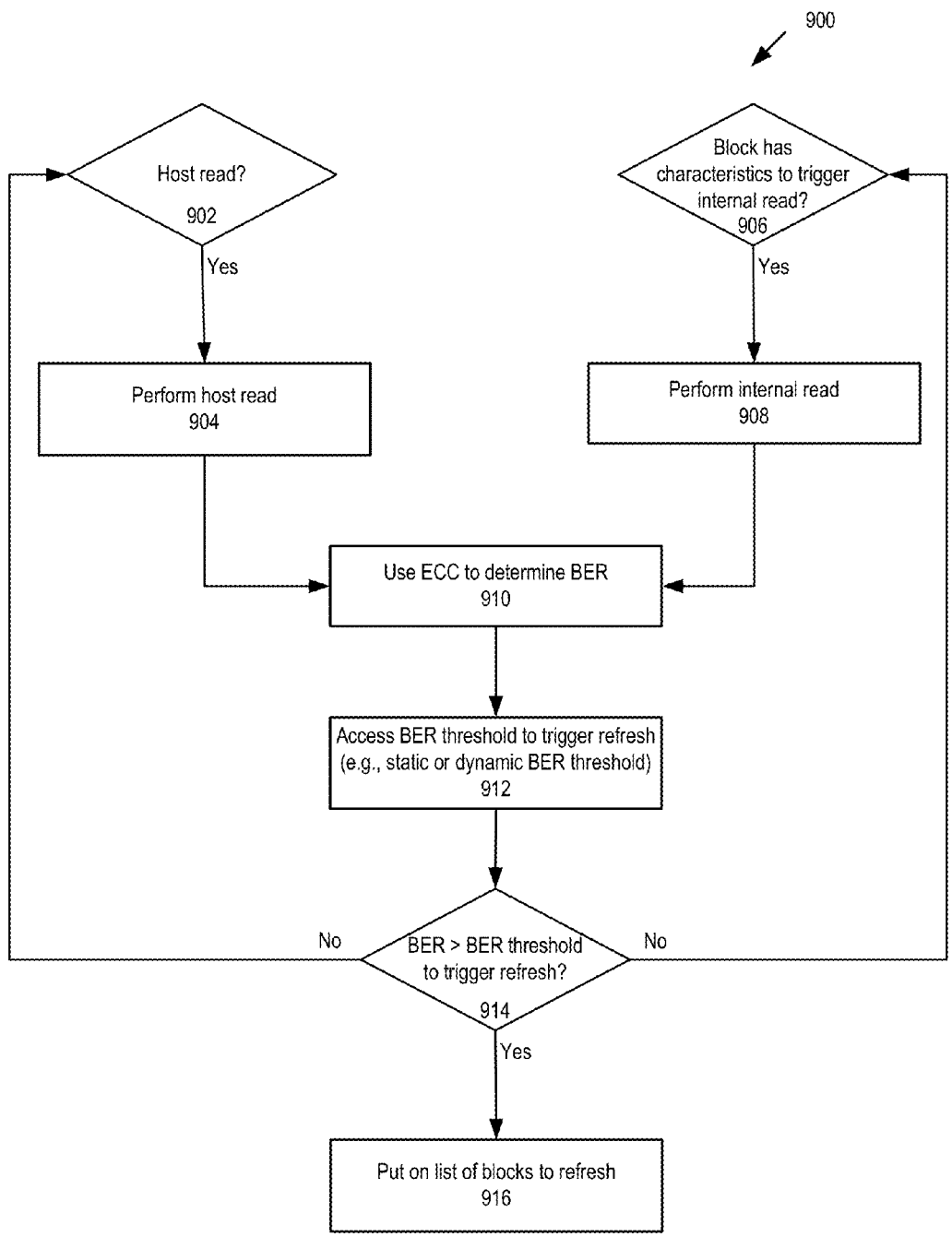
FIG. 9 illustrates a flow chart of an example of different ways to trigger reading the data, using error correction coding (ECC) to determine bit error rate (BER), and using the BER to determine whether to refresh the data.

FIG. 9 illustrates a flow chart 900 of an example of different ways to trigger reading the data, using error correction coding (ECC) to determine bit error rate (BER), and using the BER to determine whether to refresh the data. At 902, it is determined whether a host read is requested. In response to determining that the host read is requested, at 904, the host read is performed. Alternatively, an internal read may be performed. For example, the memory system controller may analyze various characteristics of a block, such as the P/E cycles, to determine whether a block is a candidate for an internal read. More specifically, a block with a high P/E, indicating a more used block and therefore more prone to errors, may be a candidate for an internal read. At 906, it is determined whether a block includes the characteristics to trigger an internal read. If yes, at 908, the internal read is performed.

At 910, the ECC engine is used to determine the BER. At 912, the BER threshold to trigger a refresh is accessed. As discussed above, the BER threshold may be static or dynamic. At 914, the BER is compared against the BER threshold. In response to determining that the BER is greater than the BER threshold, at 916, the block (or a sub-part of the block) is put on a list of blocks (or sub-parts of blocks) to refresh.

Figure 10A:
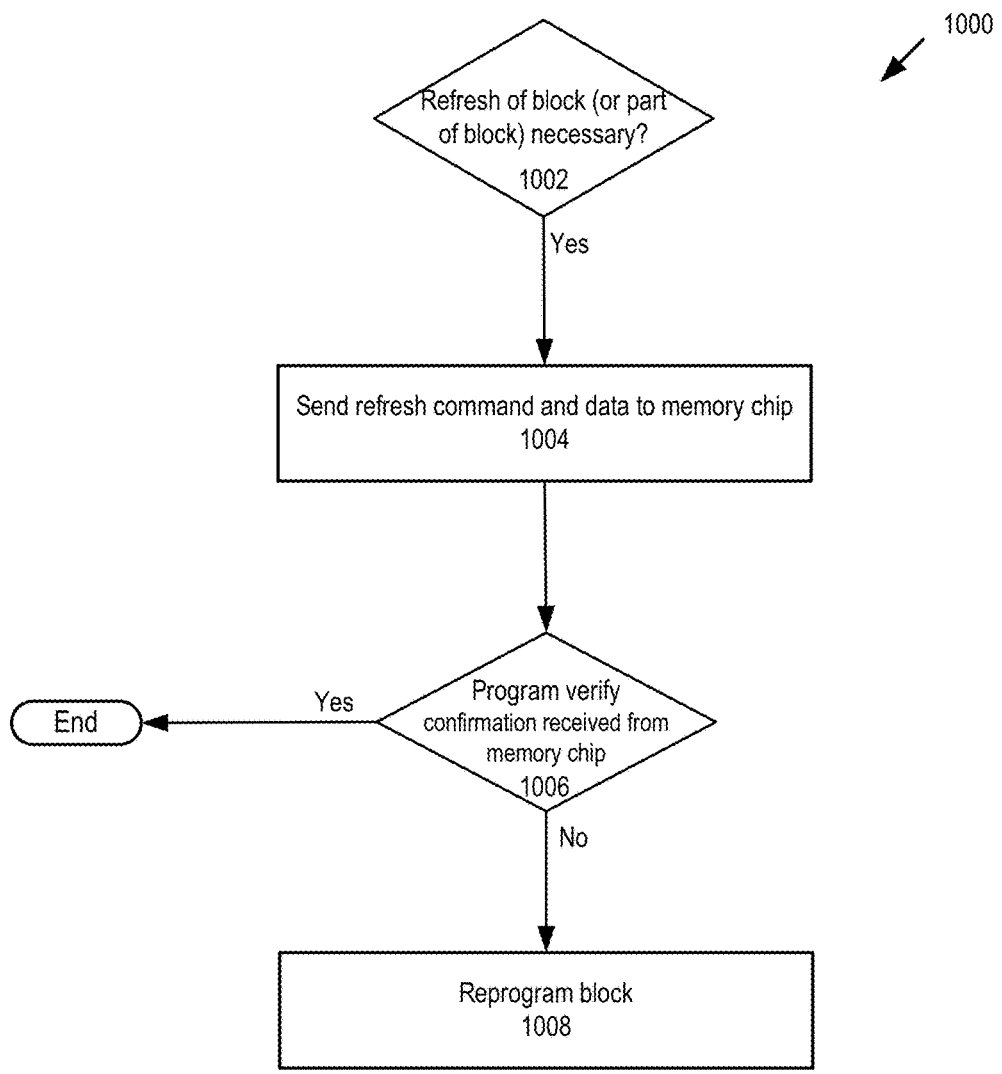
FIG. 10A illustrates a flow chart of a first example of performing a refresh on the data from the perspective of the memory device controller controlling the memory chip.

FIG. 10A illustrates a flow chart 1000 of a first example of performing a refresh on the data from the perspective of the memory device controller controlling the memory chip in which the memory chip performs the verification of refresh. At 1002, the memory system controller determines whether to perform the refresh on the block (or part of the block). If yes, at 1004, the memory system controller sends a refresh command and the data to the memory chip. At 1006, the memory system controller determines whether the memory chip has returned a program verify confirmation. As discussed below, the program verify confirmation is an indication by the memory chip that the refresh was successfully performed. In response to the memory chip controller determining that the program verify confirmation was not received, at 1008, the memory system controller may order a reprogram the block. For example, the memory system controller may order to memory chip to program the data into a separate block (such as by using the sequence illustrated in FIG. 7A), and then order the erase of the block. Alternatively, in response to the memory chip controller determining that the program verify confirmation was not received, the memory chip controller may command the memory chip to perform the refresh again. In response to receiving a second indication that the program verify confirmation was not received, the memory system controller may order a reprogram the block.

Figure 10B:
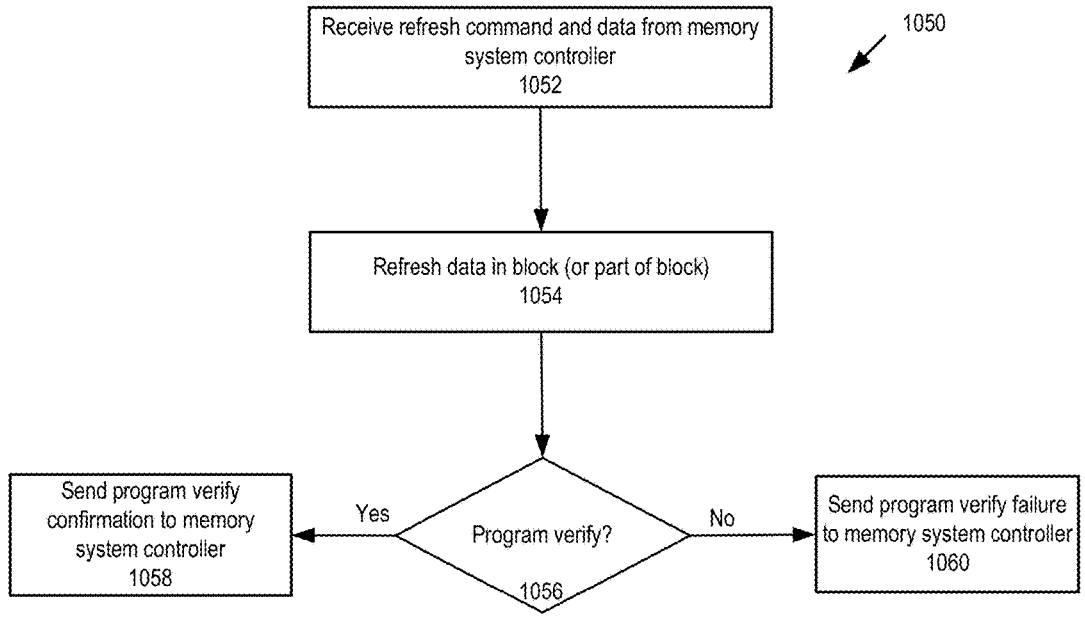
FIG. 10B illustrates a flow chart of the first example of performing a refresh on the data from the perspective of the memory chip.

FIG. 10B illustrates a flow chart 1050 of the first example of performing a refresh on the data from the perspective of the memory chip in which the memory chip performs the verification of refresh. At 1052, the memory chip receives the refresh command and data from the memory system controller. At 1054, the memory chip refreshes part (or all) of the block. At 1056, the memory chip performs a program verify to verify whether the refresh was successful. In response to determining that the program verify occurred, at 1058, the memory chip may send a program verify confirmation to the memory system controller. In response to determining that the program verify did not occur, at 1060, the memory chip may send a program verify failure to the memory system controller.

In an alternate embodiment, in response to determining that the program verify indicated a failure, the memory chip may perform the refresh again. For example, the memory chip may modify the voltage to perform the refresh (e.g., increase the voltage) and then perform the refresh with the modified voltage. After which, the memory chip may perform the program verify. The memory chip may iterate these steps a predetermined number of times, with each iteration checking the program verify. If after the predetermined number of iterations a program verify did not occur, the memory chip may send the program verify failure to the memory system controller.

Figure 11A:
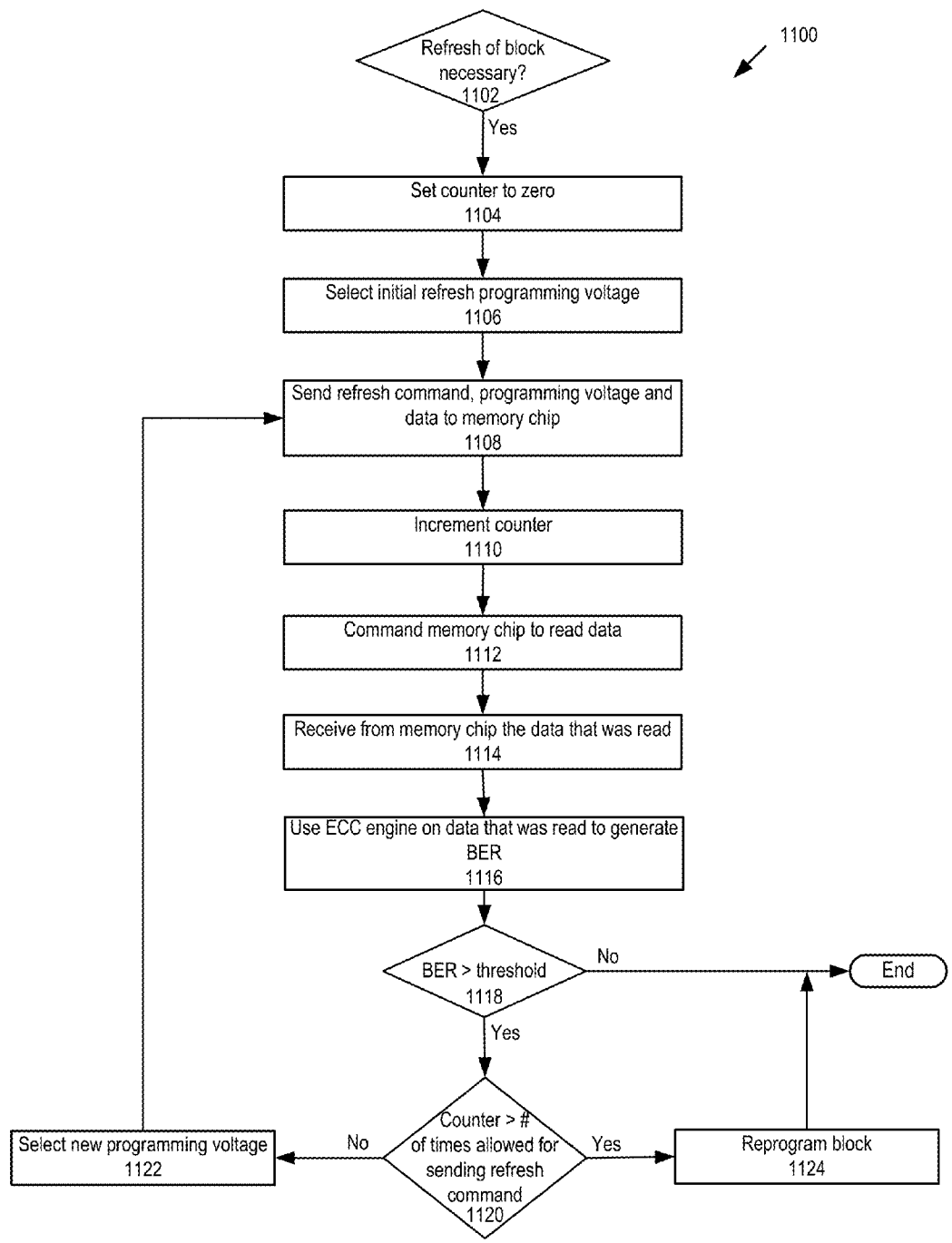
FIG. 11A illustrates a flow chart of a second example of performing a refresh on the data from the perspective of the memory device controller controlling the memory chip.

FIG. 11A illustrates a flow chart 1100 of a second example of performing a refresh on the data from the perspective of the memory device controller controlling the memory chip in which the memory system controller performs the verification. At 1102, the memory system controller determines whether a refresh is necessary or warranted. If so, at 1104, the memory system controller sets a counter to zero. At 1106, the memory system controller sets the initial refresh programming voltage. As discussed above, the initial refresh programming voltage may be static or dynamic. For example, in one embodiment, the initial refresh programming voltage may be selected based on the BER.

At 1108, the refresh command, programming voltage and data are sent to the memory chip. At 1110, the counter is incremented. At 1112, the memory system controller commands the memory chip to read the data that was refreshed. At 1114, the memory system controller receives the data from the memory chip that was read. At 1116, the memory system controller uses the ECC engine on the data read to determine the BER.

At 1118, the memory system controller determines whether the BER is less than a threshold. In a first embodiment, the memory system controller may compare the BER with the same threshold that was used to trigger the refresh. If the BER is not less than the threshold, at 1120, the counter may be checked to determine whether the number of iterations (as indicated by the counter) are less than the number of times allowed for resending refresh command. If the number of iterations is less than the number of times allowed to iterate, at 1122, the memory system controller selects a new programming voltage, and then iterates to 1108. The new programming voltage selected may comprise an increase from the initial programming voltage. The increase in the programming voltage may be static and predetermined. Alternatively, the increase in the programming voltage may be dynamic, such as dependent on the BER.

In response to determining at 1120 that the number of times of sending the refresh command has been exceeded, at 1124, the block is reprogrammed. For example, the memory system controller may order to memory chip to program the data into a separate block (such as by using the sequence illustrated in FIG. 7A), and then order the erase of the block.

Figure 11B:
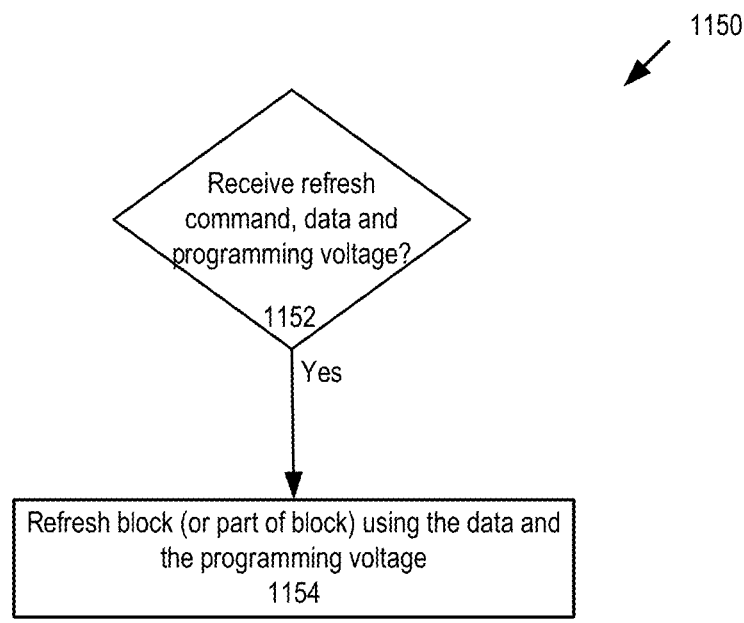
FIG. 11B illustrates a flow chart of the second example of performing a refresh on the data from the perspective of the memory chip.

FIG. 11B illustrates a flow chart 1150 of the second example of performing a refresh on the data from the perspective of the memory chip in which the memory system controller as opposed to the memory chip performs the verification. At 1152, it is determined whether the memory chip receives the refresh command, programming voltage and data. In response to receipt, at 1154, the memory chip refreshes the block (or part of the block) using programming voltage and data.

Figure 12:
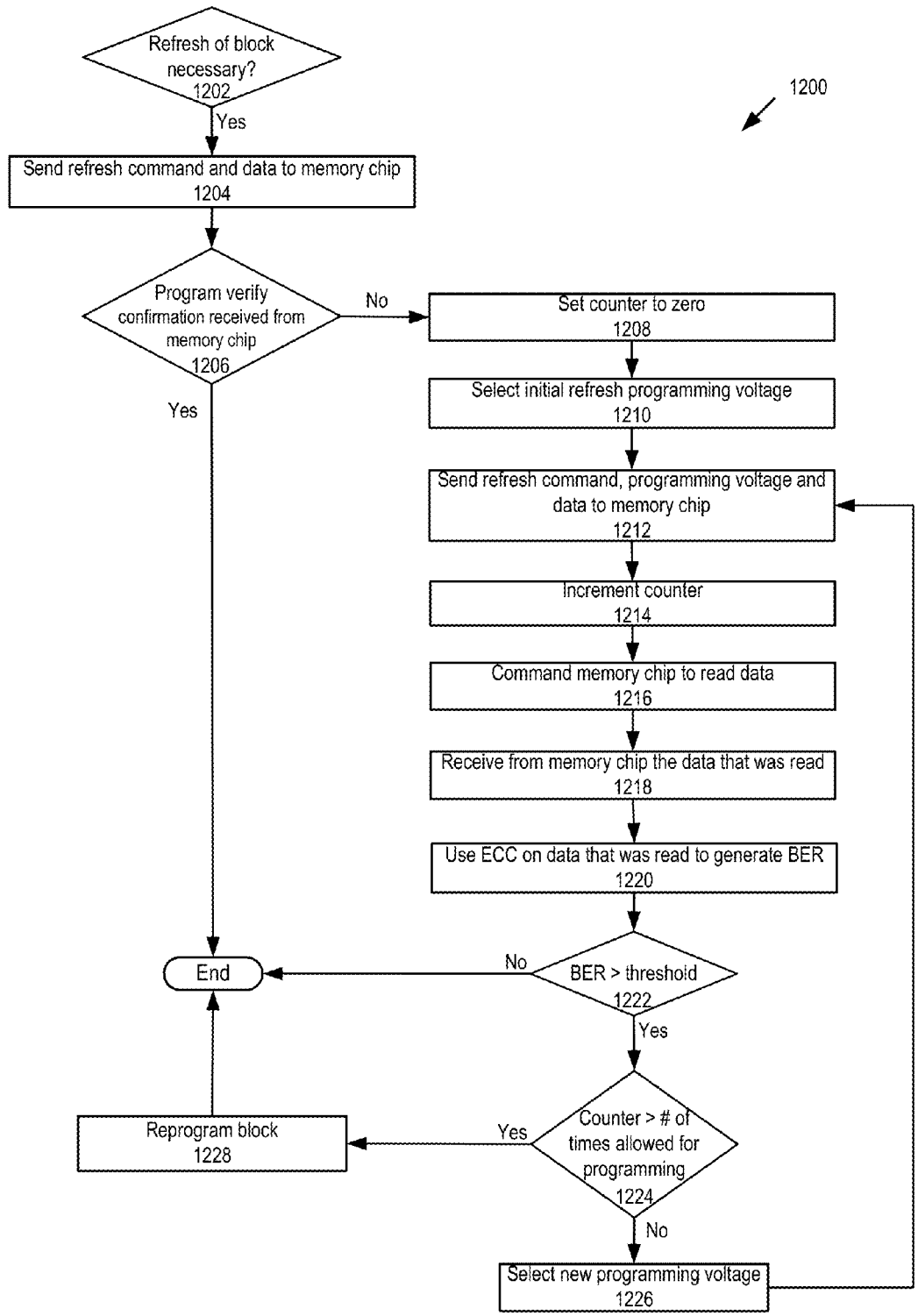
FIG. 12 illustrates a flow chart of a third example of performing a refresh on the data from the perspective of the memory device controller controlling the memory chip.

FIG. 12 illustrates a flow chart 1200 of a third example of performing a refresh on the data from the perspective of the memory device controller controlling the memory chip in which both the memory system controller and the memory chip perform verification. At 1202, the memory system controller determines whether to perform the refresh on the block (or part of the block). If yes, at 1204, the memory system controller sends a refresh command and the data to the memory chip. At 1206, the memory system controller determines whether the memory chip has returned a program verify confirmation. As discussed above with respect to FIG. 10B, the memory chip may perform a program verify.

In response to determining that the program verify confirmation was not received, at 1208, the memory system controller sets a counter to zero. At 1210, the memory system controller sets the initial refresh programming voltage. At 1212, the refresh command, programming voltage and data are sent to the memory chip. At 1214, the counter is incremented. At 1216, the memory system controller commands the memory chip to read the data that was refreshed. At 1218, the memory system controller receives the data from the memory chip that was read. At 1220, the memory system controller uses the ECC engine on the data read to determine the BER.

At 1222, the memory system controller determines whether the BER is less than a threshold (such as the threshold used to trigger a refresh). If the BER is not less than the threshold, at 1224, the counter may be checked to determine whether the number of iterations (as indicated by the counter) are less than the number of times allowed for resending refresh command. If the number of iterations is less than the number of times allowed to iterate, at 1226, the memory system controller selects a new programming voltage, and then iterates to 1212. As discussed above, the new programming voltage selected may comprise an increase from the initial programming voltage, with the increase being static and predetermined, or being dynamic. In response to determining at 1224 that the number of times of sending the refresh command has been exceeded, at 1228, the block is reprogrammed.

As discussed above, the determination whether to perform a refresh may be made at various times. For example, the determination may be made based on an event being performed, such as based on the programming of data into a block. In one embodiment, programming the data into the block (such as folding from SLC to MLC, discussed below with respect to FIG. 13A) may trigger determining whether to perform the refresh. In an alternate embodiment, a time elapsed since the programming of the data into the block (such as if the time elapsed since programmed is greater than a predetermined amount, discussed below with respect to FIG. 13B) may trigger determining whether to perform the refresh. As another example, the determination may be made based on the memory device itself. In one embodiment, an age (or an age indicator) of a block in the memory may trigger determination whether to perform the refresh (such as a program erase count greater than a predetermined threshold, discussed below with respect to FIG. 13C). Further, the thresholds by which to make the determination whether to perform the refresh may vary.

Figure 13A:
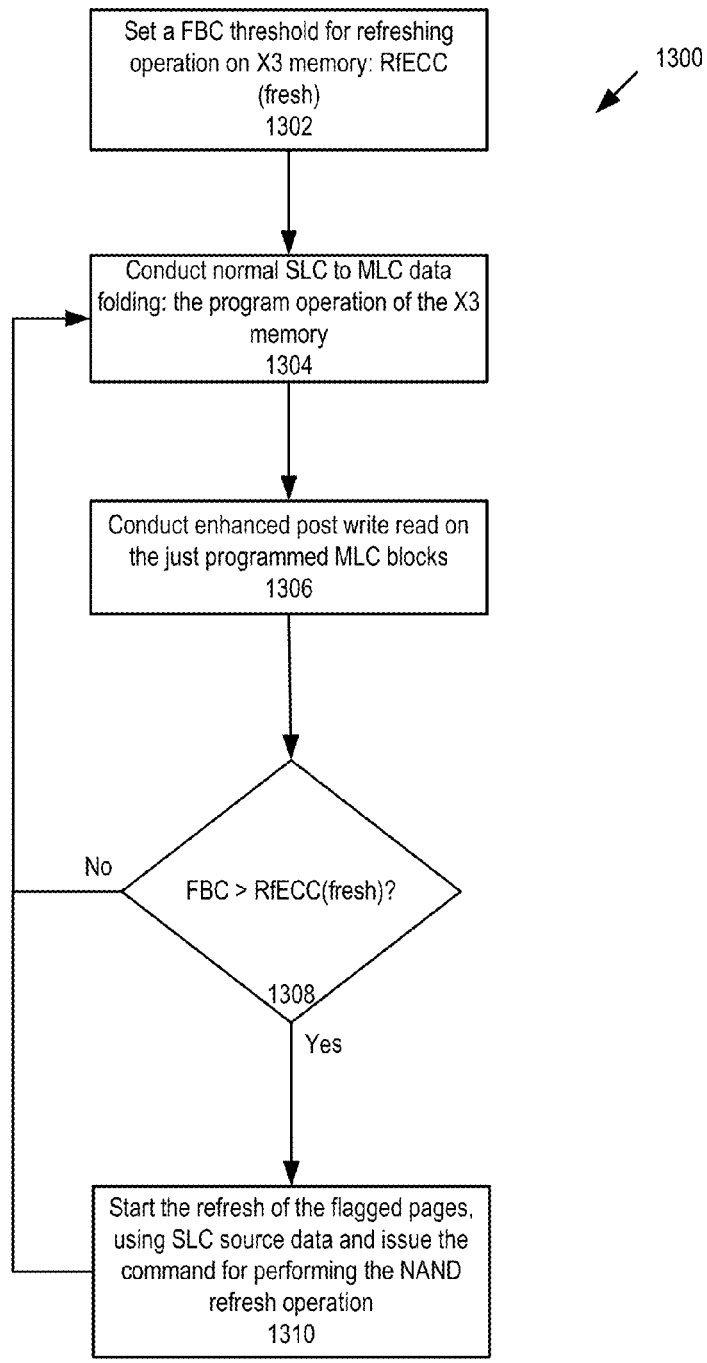
FIG. 13A illustrates a flow chart for determining whether to perform and performing a refresh operation after a programming operation.

FIG. 13A illustrates a flow chart 1300 for determining whether to perform, and performing a refresh operation after a programming operation. The programming of a block may trigger determination whether to perform the refresh operation. At 1302, the failed bit count (FBC) threshold (RfECC (fresh)) is set for the particular operation, namely for a program operation for X3 memory. At 1304, a normal SLC to MLC data fold is performed, with the folding operation occurring in X3 memory. An example of folding data from SLC to MLC is disclosed in U.S. Published Application No. 2013-0173844 A1. The folding operation may result in a FBC that is greater than desired.

At 1306, an enhanced post write read on the just-programmed blocks is performed. More specifically, an ECC engine may analyze the result of the read in order to determine the FBC. Thus, in addition to the internal verify performed on the NAND memory chips (performed during the programming of the data block), the system memory controller may use the ECC engine to verify the write. At 1308, the FBC is compared with the RfECC(fresh). If the FBC is greater than the RfECC(fresh) (e.g., the FBC is greater than an amount desired immediately upon programming the block), then at 1310, the memory system controller starts a refresh operation on the flagged sections of the block (e.g., certain pages with in the block) using SLC source data and issues the command to the memory chip to perform the NAND refresh operation. More specifically, the data in the SLC block, used in the fold operation, may be sent to the memory chip along with the refresh command.

Figure 13B:
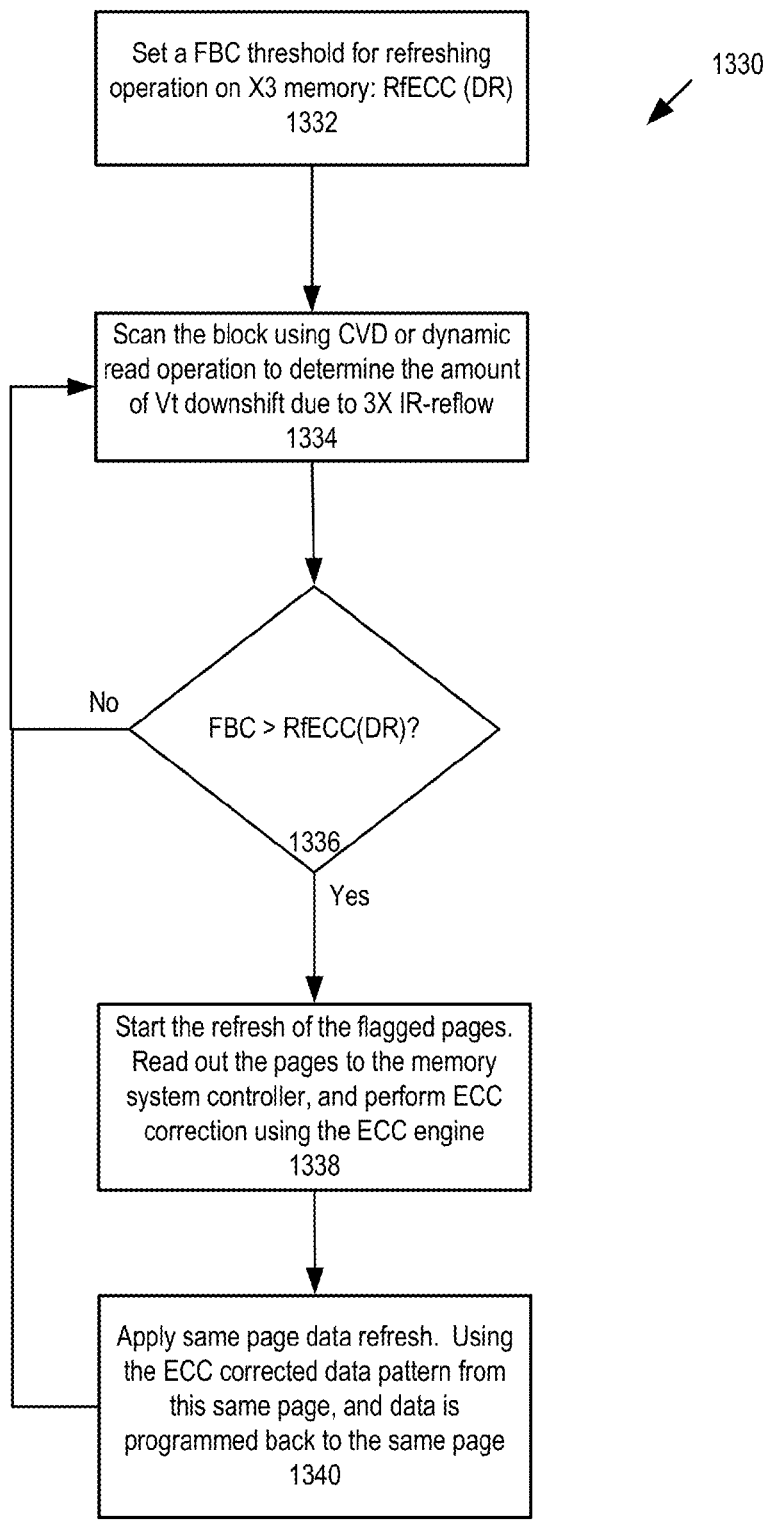
FIG. 13B illustrates a flow chart for determining whether to perform and performing a refresh operation on a block suffering from data retention.

FIG. 13B illustrates a flow chart 1330 for determining whether to perform and performing a refresh operation on a block suffering from data retention. As discussed above, over time, the data in the blocks may suffer data retention problems. In this regard, the longer the data is stored in the block, the higher the likelihood of data retention problems. Thus, during idle time, blocks may be examined to determine how long the data has been stored in the blocks. In one embodiment, blocks that include data stored therein for a time period longer than a predetermined amount of time may be flagged for determination whether to perform the refresh operation. In an alternate embodiment, blocks that have data stored therein for the longest time (compared to other blocks) may be flagged for determination whether to perform the refresh operation.

At 1332, the failed bit count (FBC) threshold (RfECC (DR)) is set for the particular operation, namely for a block suffering from data retention. As one example, severely data retention stressed blocks such as 3X infra-red (IR)-X reflow or DR blocks may be analyzed. At 1334, the block is scanned using CVD or a dynamic read operation to determine the amount of Vt downshift due to 3X IR-reflow. CVD is one type of cell Vt distribution. CVD may be used as a finer format of dynamic read whereby the read voltages are changed incrementally until the result of the read, as determined by the ECC engine, is sufficiently correctable.

At 1336, the FBC is compared with the RfECC(DR). If the FBC is greater than the RfECC(DR), then at 1338, the memory system controller starts a refresh operation on the flagged pages. Unlike FIG. 13A, in which the SLC source data is used, the pages are read out to the memory system controller. The memory system controller may then perform ECC correction using the ECC engine in order to obtain the corrected data to send to the memory chip for use in the refresh.

At 1340, the same page data refresh is applied. As discussed above, the ECC corrected data pattern from this same page is used for the refresh. In this regard, the ECC corrected data pattern is sent to the memory chip, which may use the ECC corrected data pattern to refresh the same page.

Figure 13C:
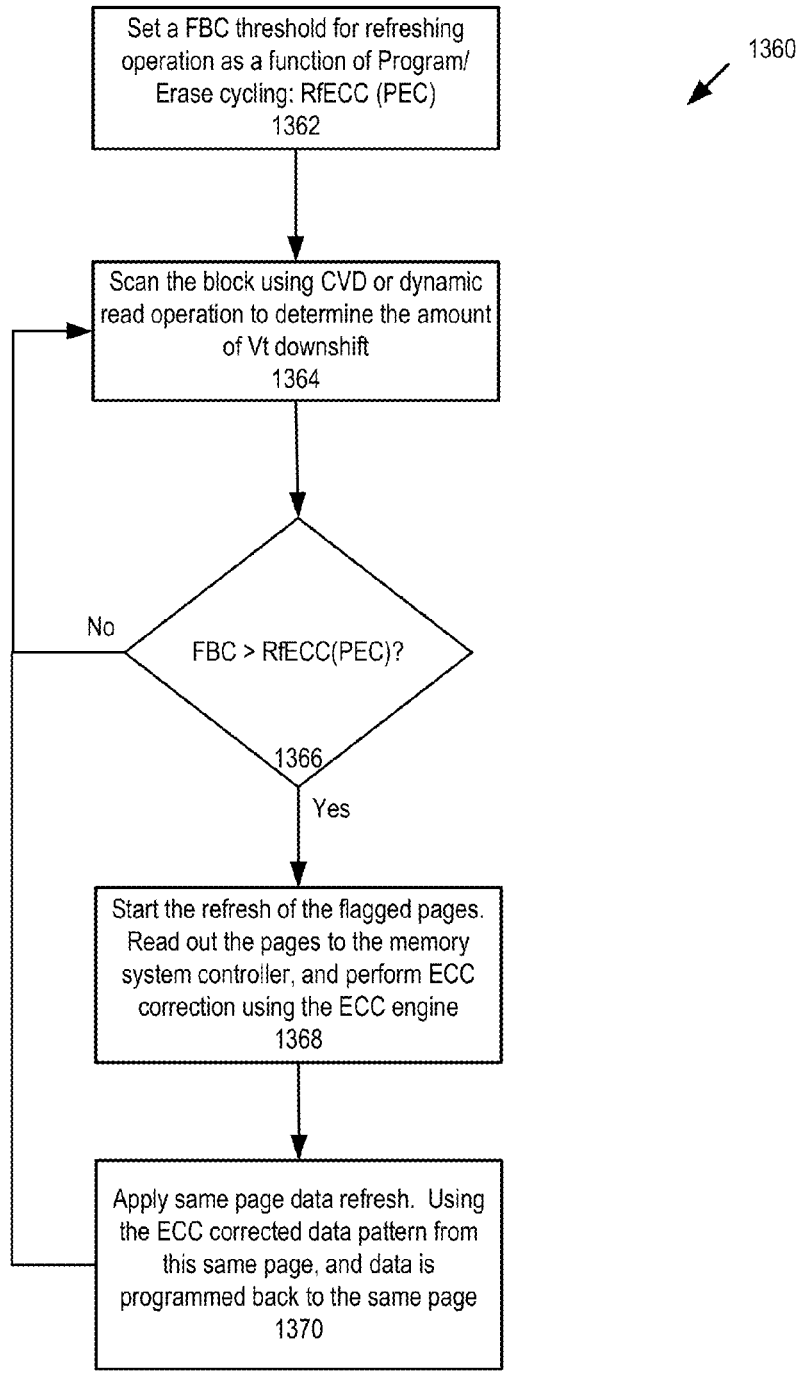
FIG. 13C illustrates a flow chart for determining whether to perform and performing a refresh operation on a block suffering from cycling stress.

FIG. 13C illustrates a flow chart 1360 for determining whether to perform and performing a refresh operation on a block suffering from cycling stress (e.g., a block having a high P/E count (PEC)). As discussed above, performance of blocks may deteriorate due to age or wear. In this regard, an age indicator may be used to determine whether a block may potentially suffer from data retention problems. Thus, during idle time, the age indicators (e.g., P/E count) for the blocks may be examined to determine the relative age or wear of the blocks. In one embodiment, blocks that have P/E count greater than a predetermined P/E count may be flagged for determination whether to perform the refresh operation. In an alternate embodiment, blocks that have the highest P/E counts (compared to other blocks) may be flagged for determination whether to perform the refresh operation.

At 1362, the failed bit count (FBC) threshold (RfECC (PEC)) is set for the particular operation, namely for a block suffering from a high PEC. At 1364, the block is scanned using CVD or a dynamic read operation to determine the amount of Vt downshift due.

At 1366, the FBC is compared with the RfECC(PEC). If the FBC is greater than the RfECC(PEC), then at 1368, the memory system controller starts a refresh operation on the flagged pages. Unlike FIG. 13A, in which the SLC source data is used, the pages are read out to the memory system controller. The memory system controller may then perform ECC correction using the ECC engine in order to obtain the corrected data to send to the memory chip for use in the refresh.

At 1370, the same page data refresh is applied. As discussed above, the ECC corrected data pattern from this same page is used for the refresh. In this regard, the ECC corrected data pattern is sent to the memory chip, which may use the ECC corrected data pattern to refresh the same page.

The instructions may be embodied in a computer-readable medium. The computer-readable medium may be a single medium, or the computer-readable medium may be a single medium or multiple media, such as a centralized or distributed database, and/or associated caches and servers that store one or more sets of instructions. The term "computer-readable medium" may also include any medium that may be capable of storing, encoding or carrying a set of instructions for execution by a processor or that may cause a computer system to perform any one or more of the methods or operations disclosed herein.

The computer-readable medium may include a solid-state memory such as a memory card or other package that houses one or more non-volatile read-only memories. The computer-readable medium also may be a random access memory or other volatile re-writable memory. Additionally, the computer-readable medium may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that may be a tangible storage medium. The computer-readable medium is preferably a tangible storage medium. Accordingly, the disclosure may be considered to include any one or more of a computer-readable medium or a distribution medium and other equivalents and successor media, in which data or instructions may be stored.

Alternatively or in addition, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations.

The illustrations described herein are intended to provide a general understanding of the structure of various embodiments. The illustrations are not intended to serve as a complete description of all of the elements and features of apparatus, processors, and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

What is claimed is:

1. A method comprising:
   programming data into a portion of a memory chip coupled to a memory controller in a memory device, the memory chip including a memory cell, the programming including writing a datum of the data to the memory cell using a first programming scheme that writes the datum to the memory cell three times, and the first programming scheme further comprises:
     a first programming step using a first programming voltage;
     a foggy programming step using a second programming voltage; and
     a fine programming step;
   determining a number of program/erase cycles performed on the memory cell is above a threshold; and responsive to the determining,
   analyzing the portion of the memory chip using an error detection scheme, by:
     performing a post-write read of the data in the portion of memory; and
     determining, based on the post-write read of the data, a bit error rate of the data in the portion of memory is above a threshold, wherein the threshold is variable based on a condition of the memory chip; and then,
   refreshing the data in the portion of memory using a first refresh voltage and a second programming scheme, the second programming scheme consisting of the fine programming step; and in response to determining the refreshing was unsuccessful,
   changing the first refresh voltage to a second refresh voltage; and
   refreshing the data in the portion of memory using the second refresh voltage and the second programming scheme.

2. The method of claim 1, further comprising: determining the bit error rate of the data in the portion of memory by using error correction coding of the data from the post-write read.

3. The method of claim 1, wherein a condition of the memory chip comprises at least one selected from a group comprising: a state of the memory chip, a value indicative of age of the memory chip, and a value indicative of wear of the memory chip.

4. The method of claim 3, wherein value indicative of age of the memory chip is based on at least one selected from the group comprising: a program/erase cycle count of the memory chip and a number of reads of the memory chip.

5. The method of claim 3, further comprising:
   determining a condition of the memory block is a first state after data from a single level cell is folded into a multi-level cell;
   setting the threshold to a first threshold value based on the first state;
   performing a post-write read of data in the portion of the memory using the first threshold value; and then
   setting the threshold to a second threshold value, different from the first threshold value.

6. A memory device comprising:
   one or more memory chips; and
   a controller in communication with a memory chip, the controller configured to:
     program data into a memory cell in a section of memory in the memory chip using a first programming scheme, wherein the first programming scheme writes to the memory cell three times, and the first programming scheme further comprises:

a first programming step using a first programming voltage;
a foggy programming step using a second programming voltage; and
a fine programming step;
determine a number of program/erase cycles performed on the memory cell is above a threshold; and responsive to the determining;
analyze the section of the memory using an error detection scheme by the controller configured to:
perform a post-write read of the data in the section of memory;
determine, based on the post-write read of the data, a bit error rate of the data in the section of the memory is above a threshold, wherein the threshold is variable based on a condition of the memory chip; and then
refresh the data in the section of the memory using a first refresh voltage and a second programming scheme, the second programming scheme consisting of the fine programming step; and in response to determining the refresh was unsuccessful,
change the first refresh voltage to second refresh voltage and, using the second refresh voltage and the second programming scheme, to refresh the data in the section of the memory.

7. The memory device of claim 6, wherein the controller is further configured to determine the bit error rate by
using error correction coding of the data from the post-write read.

8. The memory device of claim 6, a condition of the memory chip comprises at least one selected from a group comprising: a state of the memory chip, a value indicative of age of the memory chip, and a value indicative of wear of the memory chip.

9. The memory device of claim 8, wherein the value indicative of age of the memory chip is based on at least one selected from the group comprising: a program/erase cycle count of the memory chip and a number of reads of the memory chip.

10. The memory device of claim 8, wherein the controller is further configured to:
determine a condition of the memory cell is a first state after data from a single level cell is folded into a multi-level cell;
set the threshold to a first threshold value based on the first state;
perform a post-write read of data in the portion of the memory using the first threshold value; and then
set the threshold to a second threshold value, different from the first threshold value.

11. A method comprising:
programming data into a multi-level-cell (MLC) section of a memory chip coupled to a memory controller in a memory device, the programming including writing the data using a first programming scheme that writes the data to the MLC section three times, and the first programming scheme further comprises:
a first programming step using a first programming voltage;
a foggy programming step using a second programming voltage; and
a fine programming step; responsive to determining that the programming of the data into the MLC section of the memory chip is due to folding of the data from a single-level cell (SLC) section of the memory,
performing a post-write read of the data in the MLC section;
determining, based on the post-write read of the data, a bit error rate of the data in the MLC section is above a threshold wherein the threshold is variable based on a condition of the memory chip; and then
refreshing the data in the MLC section using a first refresh voltage and a second programming scheme, the second programming scheme consisting of the fine programming step; and in response to determining the refresh was unsuccessful,
changing the first refresh voltage to a second refresh voltage; and,
refreshing the MLC section using the second refresh voltage and the second programming scheme.

12. The method of claim 2, further comprising, setting the first refresh voltage based on the bit error rate.

13. The memory device of claim 6, where the controller is further configured to set the first refresh voltage based on the bit error rate.

* * * * *